(12) United States Patent
Roetteler et al.

(10) Patent No.: US 10,430,162 B2
(45) Date of Patent: Oct. 1, 2019

(54) QUANTUM RESOURCE ESTIMATES FOR COMPUTING ELLIPTIC CURVE DISCRETE LOGARITHMS

(71) Applicant: Microsoft Technology Licensing, LLC, Redmond, WA (US)

(72) Inventors: Martin Roetteler, Woodinville, WA (US); Kristin Lauter, Redmond, WA (US); Krysta Svore, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/669,929

(22) Filed: Aug. 5, 2017

(65) Prior Publication Data
US 2018/0336015 A1    Nov. 22, 2018

Related U.S. Application Data

(60) Provisional application No. 62/508,352, filed on May 18, 2017, provisional application No. 62/522,247, filed on Jun. 20, 2017.

(51) Int. Cl.
*G06F 7/72* (2006.01)
*G06N 10/00* (2019.01)
*G06F 17/50* (2006.01)

(52) U.S. Cl.
CPC ............. *G06F 7/728* (2013.01); *G06F 7/72* (2013.01); *G06F 7/721* (2013.01); *G06F 7/723* (2013.01);

(Continued)

(58) Field of Classification Search
CPC ...................................................... G06N 10/00
(Continued)

(56) References Cited

U.S. PATENT DOCUMENTS

| 7,620,672 B2 * | 11/2009 | Tucci | G06N 10/00 708/100 |
| 8,543,627 B1 * | 9/2013 | Tucci | G06N 10/00 708/274 |

(Continued)

FOREIGN PATENT DOCUMENTS

WO    WO 2016/200747    12/2016

OTHER PUBLICATIONS

Blake-Wilson et al., "Elliptic Curve Cryptography (ECC) Cipher Suites for Transport Layer Security (TLS)," RFC 4492, 35 pp. (May 2006).

(Continued)

*Primary Examiner* — Tan V Mai
(74) *Attorney, Agent, or Firm* — Klarquist Sparkman, LLP

(57) ABSTRACT

In this application, example methods for performing quantum Montgomery arithmetic are disclosed. Additionally, circuit implementations are disclosed for reversible modular arithmetic, including modular addition, multiplication and inversion, as well as reversible elliptic curve point addition. This application also shows that elliptic curve discrete logarithms on an elliptic curve defined over an n-bit prime field can be computed on a quantum computer with at most $9n+2\lceil \log_2(n) \rceil + 10$ qubits using a quantum circuit of at most $512n^3 \log_2(n) + 3572n^3$ Toffoli gates.

14 Claims, 22 Drawing Sheets

(52) U.S. Cl.
CPC ............ *G06F 7/725* (2013.01); *G06F 17/505* (2013.01); *G06F 17/5022* (2013.01); *G06N 10/00* (2019.01)

(58) Field of Classification Search
USPC .......................................................... 708/491
See application file for complete search history.

(56) References Cited

U.S. PATENT DOCUMENTS

| | | | | |
|---|---|---|---|---|
| 8,560,282 | B2* | 10/2013 | Macready | ............. B82Y 10/00 703/3 |
| 9,942,039 | B1* | 4/2018 | Gutoski | ................ H04L 9/3093 |
| 2017/0169735 | A1* | 6/2017 | Lablans | .................... G09C 1/00 |
| 2017/0250796 | A1* | 8/2017 | Samid | ................... H04L 9/0838 |

OTHER PUBLICATIONS

Bos et al., "Elliptic and Hyperelliptic Curves: A Practical Security Analysis," *Int'l Conf. on Practice and Theory in Public-Key Cryptography*, vol. 8383, pp. 203-220 (Mar. 2014).
Certicom Research, "Standards for Efficient Cryptography—SEC 2: Recommended Elliptic Curve Domain Parameters," Version 1.0, 51 pp. (Sep. 2000).
Crandall et al., *Prime Numbers—A Computational Perspective*, Springer, 604 pp. (2005).
Dierks et al., "The transport layer security (TLS) protocol," Version 1.2, RFC 5246, 98 pp. (Aug. 2008).
Diffie et al., "New directions in cryptography," *IEEE Trans. Information Theory*, vol. 22, pp. 644-654 (Nov. 1976).
Dingledine et al., "Tor: The second-generation onion router," *Proc. USENIX Security Symposium*, pp. 303-320 (Aug. 2004).
"ECC Brainpool Standard Curves and Curve Generation," Ver. 1.0, 43 pp. (Oct. 2005).
El Gamal, "A public key cryptosystem and a signature scheme based on discrete logarithms," *Advances in Cryptology, Proc. of CRYPTO*, pp. 10-18 (Aug. 1984).
Galbraith et al., "Recent progress on the elliptic curve discrete logarithm problem," *Des. Codes Cryptography*, vol. 78, pp. 51-72 (2016).
Gordon, "Discrete logarithms in GF(P) using the number field sieve," *SIAM J. Discrete Math.*, vol. 6, pp. 124-138 (1993).
Hamburg, "Ed448-Goldilocks, a new elliptic curve," *IACR Cryptology ePrint Archive*, 10 pp. (2015).

International Search Report and Written Opinion dated Jul. 23, 2018, from International Patent Application No. PCT/US2018/028758, 15 pp.
Joux et al., "Improvements to the general number field sieve for discrete logarithms in prime fields. A comparison with the Gaussian integer method," *Math. Comput.*, vol. 72, pp. 953-967 (Apr. 2003).
Koblitz, "Elliptic curve cryptosystems," *Matthematics of Computation*, vol. 48, pp. 203-209 (Jan. 1987).
Langley et al., "Elliptic curves for security," RFC 7748, 22 pp. (Jan. 2016).
Miller, "Use of elliptic curves in cryptography," *Advances in Cryptology*, pp. 417-426 (Aug. 1985).
Montgomery, "Modular multiplication without trial division," *Mathematics of Computation*, vol. 44, pp. 519-521 (1985).
Nakamoto, "Bitcoin: A peer-to-peer electronic cash system," downloaded from http://bitcoin.org/bitcoin.pdf, 9 pp. (2009).
Paterson, "Formal request from TLS WG to CFRG for new elliptic curves," downloaded from http://www.ietf.org/mail-archive/web/cfrg/current/msg04655.html, 4 pp. (Jul. 2014).
Pollard, "Monte Carlo Methods for Index Computation (mod p)," *Math. Comput.*, vol. 32, pp. 918-924 (Jul. 1978).
Pollard, "Kangaroos, Monopoly and Discrete Logarithms," *J. Cryptology*, vol. 13, pp. 437-447 (Aug. 2000).
Proos et al., "Shor's discrete logarithm quantum algorithm for elliptic curves," arXiv:quant-ph/0301141, pp. 1-34 (Jan. 2004).
Rivest et al., "A Method for Obtaining Digital Signatures and Public-Key Cryptosystems," *Commun. ACM*, vol. 21, pp. 120-126 (1978).
Shor, "Algorithms for Quantum Computation: Discrete Logarithms and Factoring," *IEEE Annual Symp. on Foundations of Computer Science*, pp. 124-134 (Nov. 1994).
Silverman, *The Arithmetic of Elliptic Curves*, $2^{nd}$ Edition, 522 pp. (2009).
Stebila et al., "Elliptic Curve Algorithm Integration in the Secure Shell Transport Layer," RFC 5656, 20 pp. (Dec. 2009).
U.S. Department of Commerce, "Digital Signature Standard (DSS)," FIPS PUB 186-4, 130 pp. (Jul. 2013).
Van Oorschot et al., "Parallel Collision Search with Cryptanalytic Applications," *J. Cryptology*, vol. 12, pp. 1-28 (1999).
Wecker et al., "LIQUi|>: A Software Design Architecture and Domain-Specific Language for Quantum Computing," arXiv:1402.4467v1, 14 pp. (Feb. 2014).
WhatsApp, "WhatsApp Encryption Overview," Technical white paper, 12 pp. (Apr. 2016).

* cited by examiner

QUANTUM RESOURCE ESTIMATES FOR COMPUTING ELLIPTIC CURVE DISCRETE LOGARITHMS

CROSS REFERENCE TO RELATED APPLICATIONS

This application claims the benefit of U.S. Provisional Application No. 62/508,352, entitled "QUANTUM RESOURCE ESTIMATES FOR COMPUTING ELLIPTIC CURVE DISCRETE LOGARITHMS" filed on May 18, 2017, and U.S. Provisional Application No. 62/522,247, entitled "QUANTUM RESOURCE ESTIMATES FOR COMPUTING ELLIPTIC CURVE DISCRETE LOGARITHMS" and filed on Jun. 20, 2017, both of which are hereby incorporated herein by reference.

FIELD

This application relates generally to quantum computers. More specifically, the application concerns methods for performing quantum Montgomery arithmetic and for performing precise quantum resource estimates for Shor's algorithm to compute discrete logarithms on elliptic curves over prime fields

SUMMARY

In this application, example methods for performing quantum Montgomery arithmetic are disclosed and precise quantum resource estimates are disclosed for Shor's algorithm to compute discrete logarithms on elliptic curves over prime fields. The estimates are derived from a simulation of a Toffoli gate network for controlled elliptic curve point addition, implemented within the framework of the quantum computing software toolsuite LIQUi⟩. Additionally, circuit implementations are disclosed for reversible modular arithmetic, including modular addition, multiplication and inversion, as well as reversible elliptic curve point addition. This disclosure also shows that elliptic curve discrete logarithms on an elliptic curve defined over an n-bit prime field can be computed on a quantum computer with at most $9n+2\lceil\log_2(n)\rceil+10$ qubits using a quantum circuit of at most $512n^3 \log_2(n)+3572n^3$ Toffoli gates. Simulations are also disclosed where Toffoli networks are simulated corresponding to the controlled elliptic curve point addition as the core piece of Shor's algorithm for the NIST standard curves P-192, P-224, P-256, P-384 and P-521. Example approaches allow gate-level comparisons to recent resource estimates for Shor's factoring algorithm.

The disclosed methods can be implemented, at least in part, as computer-executable instructions (software) stored on one or more computer-readable media (storage devices or memory devices) and executable by one or more processors. The processors can be classical computer processors that are used as part of the system that controls, monitors, and/or reads out results from a quantum device (e.g., a quantum computer).

DETAILED DESCRIPTION

1 General Considerations

Figure 1:
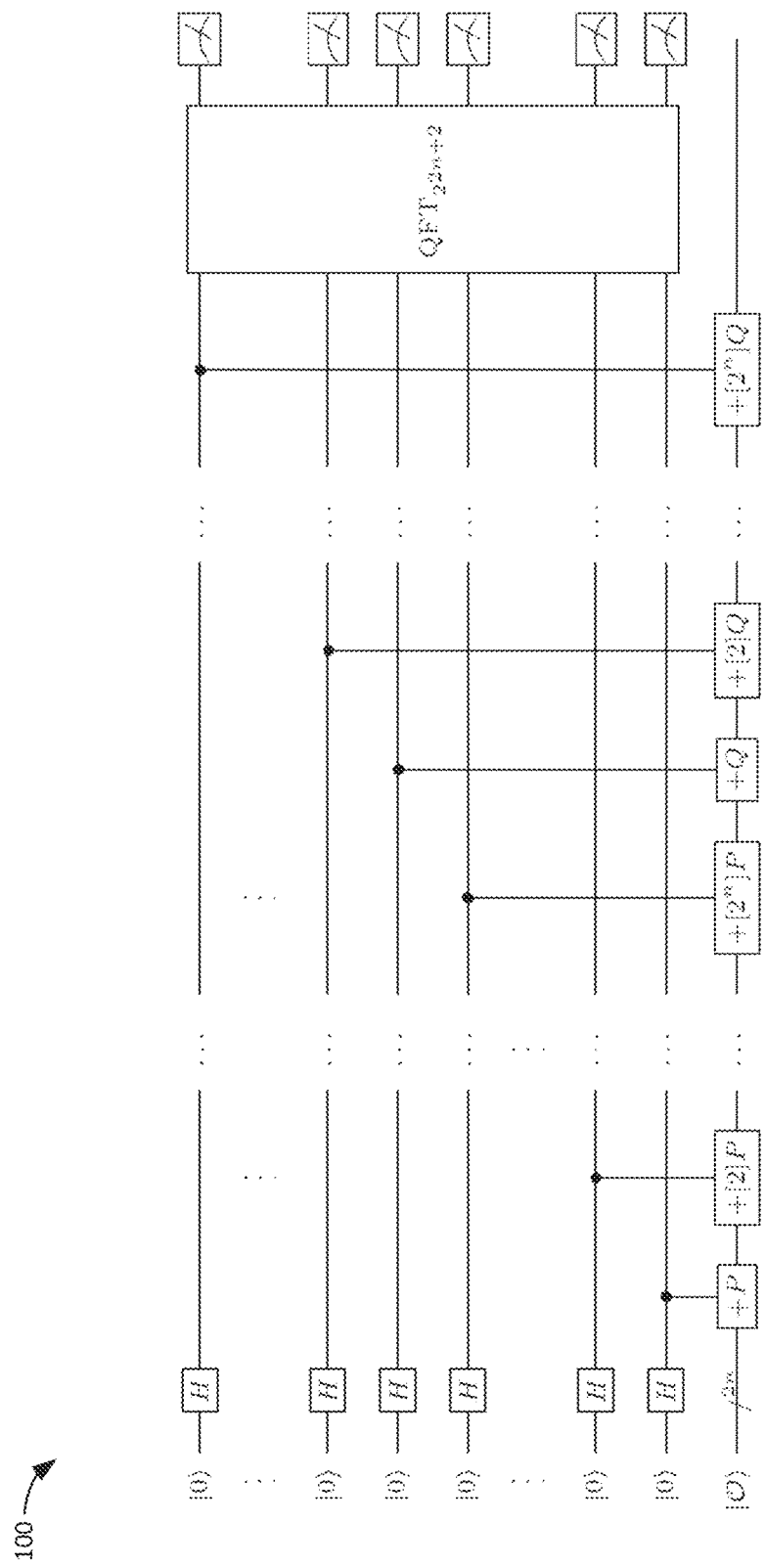
FIG. 1 is a schematic block diagram of a circuit for using Shor's algorithm to compute the discrete logarithm in the subgroup of an elliptic curve generated by a point P.

As used in this application, the singular forms "a," "an," and "the" include the plural forms unless the context clearly dictates otherwise. Additionally, the term "includes" means "comprises." Further, the term "coupled" does not exclude the presence of intermediate elements between the coupled items. Further, as used herein, the term "and/or" means any one item or combination of any items in the phrase.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

2 Overview

Elliptic curve cryptography (ECC). Elliptic curves are a fundamental building block of today's cryptographic landscape. Thirty years after their introduction to cryptography, they are used to instantiate public key mechanisms such as key exchange and digital signatures that are widely deployed in various cryptographic systems. Elliptic curves are used in applications such as transport layer security, secure shell, the Bitcoin digital currency system, in national ID cards, the Tor anonymity network, and the WhatsApp messaging app, just to name a few. Hence, they play a significant role in securing our data and communications.

Different standards and standardization efforts have identified elliptic curves of different sizes targeting different levels of security. See Certicom Research, "Standards for efficient cryptography 2: Recommended elliptic curve domain parameters," Standard SEC2 (Certicom, 2000); U.S. Department of Commerce/National Institute of Standards and Technology, "Digital Signature Standard (DSS). FIPS-186-4, 2013," http://nvlpubs.nist.gov/nistpubs/FIPS/NIST.FIPS.186-4.pdf; ECC Brainpool, "ECC Brainpool Standard Curves and Curve Generation," http://www.ecc-brainpool.org/download/Domain-parameters.pdf (2005); Kenneth G. Paterson, "Formal request from TLS WG to CFRG for new elliptic curves," CFRG mailing list, Jul. 14, 2014, http://www.ietf.-org/mail-archive/web/cfrg/current/msg04655.html. Notable curves with widespread use are the NIST curves P-256, P-384, P-521, which are curves in Weierstrass form over special primes of size 256, 384, and 521 bits respectively, the Bitcoin curve from the SEC2 standard and the Brainpool curves. See id. More recently, Bernstein's Curve25519, a Montgomery curve over a 255-bit prime field, has seen more and more deployment, and it has been recommended to be used in the next version of the TLS protocol along with another even more recent curve proposed by Hamburg called Goldilocks. See Moti Yung, Yevgeniy Dodis, Aggelos Kiayias, and Tal Malkin, editors, "Public Key Cryptography-PKC 2006, 9th International Conference on Theory and Practice of Public-Key Cryptography," New York, N.Y., USA, Apr. 24-26, 2006, Proceedings, volume 3958 of Lecture Notes in Computer Science (Springer, 2006); A. Langley, M. Hamburg, and S. Turner, "Elliptic curves for security," RFC 7748 (2016); Mike Hamburg. Ed, "448-Goldilocks, a new elliptic curve," IACR Cryptology ePrint Archive, 2015:625 (2015).

The security of elliptic curve cryptography relies on the hardness of computing discrete logarithms in elliptic curve groups—the difficulty of the Elliptic Curve Discrete Logarithm Problem (ECDLP). Elliptic curves have the advantage of relatively small parameter and key sizes when compared to other cryptographic schemes, such as those based on RSA or finite field discrete logarithms, when compared at the same security level. See Ronald L. Rivest, Adi Shamir, and Leonard M. Adleman, "A method for obtaining digital signatures and public-key cryptosystems," Commun. ACM, 21(2):120-126 (1978); Whitfield Diffie and Martin E. Hellman, "New directions in cryptography," IEEE Trans. Information Theory, 22(6):644-654 (1976). For example, according to NIST recommendations from 2016, a 256-bit elliptic curve provides a similar resistance against classical attackers as an RSA modulus of size 3072 bits. There is consensus about the fact that elliptic curve parameters can be an order of magnitude smaller than parameters for RSA or finite field discrete logarithm systems to provide similar security. This advantage arises from the fact that the currently known best algorithms to compute elliptic curve discrete logarithms are exponential in the size of the input parameters, whereas there exist subexponential algorithms for factoring and finite field discrete logarithms. Arjen K. Lenstra and Hendrik W. Lenstra, editors, "The development of the number field sieve," volume 1554 of Lecture Notes in Mathematics. Springer (1993); Richard Crandall and Carl Pomerance, editors, "Prime Numbers—A Computational Perspective," Springer (2005); Daniel M. Gordon, "Discrete logarithms in GF(P) using the number field sieve," SIAM J. Discrete Math., 6(1):124-138 (1993); Antoine Joux and Reynald Lercier, "Improvements to the general number field sieve for discrete logarithms in prime fields," a comparison with the gaussian integer method. Math. Comput., 72(242):953-967 (2003).

The Quantum Computer Threat. In his famous paper, Peter Shor presented two polynomial-time quantum algorithms, one for integer factorization and another one for computing discrete logarithms in a finite field of prime order. Peter W. Shor, "Algorithms for quantum computation: Discrete logarithms and factoring," in 35th Annual Symposium on Foundations of Computer Science, Santa Fe, N. Mex., USA, 20-22 Nov. 1994, pages 124-134 (IEEE Computer Society, 1994). Shor notes that the latter algorithm can be generalized to other fields. It also generalizes to the case of elliptic curves. Hence, given the prerequisite that a large enough general purpose quantum computer can be built, the algorithms in Shor's paper completely break all current crypto systems based on the difficulty of factoring or computing discrete logarithms. Scaling up the parameters for such schemes to sizes for which Shor's algorithm becomes practically infeasible will most likely lead to highly impractical instantiations.

Recent years have witnessed significant advances in the state of quantum computing hardware. Companies have invested in the development of qubits, and the field has seen an emergence of startups, with some focusing on quantum hardware, others on software for controlling quantum computers, and still others offering consulting services. The predominant approach to quantum hardware is focused around a digital, programmable, and universal quantum computer. With the amount of investment in quantum computing hardware, the pace of scaling is increasing and underscoring the need to understand the scaling of the difficulty of ECDLP.

Language-Integrated Quantum Operations: LIQUi|⟩. As quantum hardware advances towards larger-scale systems of upwards of 10s to 100s of qubits, there is a critical need for a software architecture to program and control the device. The LIQUi|⟩ software architecture is used to determine the resource costs of solving the ECDLP. See Dave Wecker and Krysta M. Svore. "LIQUi|⟩ A Software Design Architecture and Domain-Specific Language for Quantum Computing," https://arxiv.org/abs/1402.4467 (2014). LIQUi|⟩ is a high-level programming language for quantum algorithms embedded in F#, a compilation stack to translate and compile quantum algorithms into quantum circuits, and a simulator to test and run quantum circuits. See http://stationq.github.io/Liquid/ and https://github.com/StationQ/Liquid. LIQUi|⟩ can simulate roughly 32 qubits in 32 GB RAM, however, one can make use of the fact that reversible circuits can be simulated efficiently on classical input states for thousands of qubits.

Gate Sets and Toffoli Gate Networks. The basic underlying fault-tolerant architecture and coding scheme of a quantum computer determine the universal gate set, and hence by extension also the synthesis problems that have to be solved in order to compile high-level, large-scale algorithms into a sequence of operations that an actual physical quantum computer can then execute. A gate set that arises frequently and that has been studied often in the literature, but by no means the only conceivable gate set, is the so-called Clifford+T gate set. See Michael. A. Nielsen and Ike. L. Chuang, "Quantum Computation and Quantum Information," Cambridge University Press, Cambridge, UK (2000). This gate set consists of the Hadamard gate $$H = \frac{1}{\sqrt{2}} \begin{bmatrix} 1 & 1 \\ 1 & -1 \end{bmatrix},$$

the phase gate P=diag(1, i), and the controlled NOT (CNOT) gate which maps $(x, y) \mapsto (x, x \oplus y)$ as generators of the Clifford group, along with the T gate given by T=diag(1, $\exp(\pi i/4)$)). The Clifford+T gate set is known to be universal. See id. This means that it can be used to approximate any given target unitary single qubit operation to within precision E using sequences of length $4 \log_2(1/\varepsilon)$, and using an entangling gate such as the CNOT gate, the Clifford+T gate set can approximate any unitary operation. See Peter Selinger, "Efficient Clifford+T approximation of single-qubit operators," Quantum Information and Computation, 15(1-2):159-180 (2015); Vadym Kliuchnikov, Dmitri Maslov, and Michele Mosca, "Practical approximation of single-qubit unitaries by single-qubit quantum Clifford and T circuits," IEEE Transactions on Computers, 65(1):161-172 (2016). When assessing the complexity of a quantum circuit built from Clifford+T gates, often only T-gates are counted as many fault-tolerant implementations of the Clifford+T gate set at the logical gate level require much more resources for T-gates than for Clifford gates. See Austin G. Fowler, Matteo Mariantoni, John M. Martinis, and Andrew N. Cleland, "Surface codes: Towards practical large-scale quantum computation," Phys. Rev. A, 86:032324 (2012), arXiv:1208.0928.

In this disclosure, reversible computations are based entirely on the Toffoli gate. The Toffoli gate $|x, y, z\rangle \mapsto |x, y, z \oplus xy\rangle$ is known to be universal for reversible computing and can be implemented exactly over the Clifford+T gate set for a T-depth 1 implementation using a total of 7 qubits and for a T-depth 3 realization using a total of 3 qubits. See Michael. A. Nielsen and Ike. L. Chuang, "Quantum Computation and Quantum Information," Cambridge University Press (Cambridge, UK, 2000); Matthew Amy, Dmitri Maslov, Michele Mosca, and Martin Roetteler, "A meet-in-the-middle algorithm for fast synthesis of depth-optimal quantum circuits," Computer-Aided Design of Integrated Circuits and Systems, IEEE Transactions on, 32(6):818-830 (June 2013); Thomas Haner, Martin Roetteler, and Krysta M. Svore, "Factoring using 2n+2 qubits with Toffoli-based modular multiplication," arXiv preprint arXiv:1611.07995 (2016). As discussed in Section V of Thomas Haner, Martin Roetteler, and Krysta M. Svore, "Factoring using 2n+2 qubits with Toffoli-based modular multiplication," arXiv preprint arXiv:1611.07995 (2016) (also referred to as "HRS16"), there are two main reasons for focusing on Toffoli gate networks as our preferred realisation of quantum circuits. The first is that because the Toffoli gate can be implemented exactly over the Clifford+T gate set, Toffoli networks do not have gate synthesis overhead. The second is testability and debugging. Toffoli gate networks can be simulated using classical reversible simulators. While a fully functional simulation of a quantum circuit could be deemed feasible for circuits on up to 50 qubits, classical simulation of Toffoli gate-based circuits can deal with a lot more qubits. Also, for implementations on actual quantum hardware, Toffoli gate circuits can be debugged efficiently, where faults can be localized through binary search.

Estimating Quantum Resources for Shor's ECDLP Algorithm. Understanding the concrete requirements for a quantum computer that is able to run Shor's algorithm helps to put experimental progress in quantum computing into perspective. Although it is clear that the polynomial runtime asymptotically breaks ECC, constant factors can make an important difference when actually implementing the algorithm.

In John Proos and Christof Zalka, "Shor's discrete logarithm quantum algorithm for elliptic curves," Quantum Information and Computation, 3(4):317-344 (2003) ("Proos and Zalka"), Proos and Zalka describe how Shor's algorithm can be implemented for the case of elliptic curve groups. They conclude with a table of resource estimates for the number of logical qubits and time (measured in "1-qubit additions") depending on the bitsize of the elliptic curve. Furthermore, they compare these estimates to those for Shor's factoring algorithm and argue that computing elliptic curve discrete logarithms is significantly easier than factoring RSA moduli at comparable classical security levels. However, some questions remained unanswered by Proos and Zalka, the most poignant of which being whether it is actually possible to construct and simulate the circuits to perform elliptic curve point addition in order to get confidence in their correctness. Another question that remained open is whether it is possible to determine constants that were left in terms of asymptotic scaling and whether some of the proposed circuit constructions to compress registers and to synchronize computations can actually be implemented in code that can then be automatically generated for arbitrary input curves.

Here, embodiments are disclosed that build on the work discussed above and include a full program and simulation of the underlying arithmetic. The correctness of the algorithms is also proven, concrete resource costs measured by the overall number of logical qubits are obtained, the number of Toffoli gates is obtained, and the depth of a quantum circuit for implementing Shor's algorithm is obtained.

More specifically, this disclosure presents precise resource estimates for quantum circuits that implement Shor's algorithm to solve the ECDLP. Among the embodiments discloshed herein are:

Reversible algorithms for modular quantum arithmetic. This includes modular addition, subtraction, negation and doubling of integers held in quantum registers, modular multiplication, squaring and modular inversion.

For modular multiplication, two different approaches are disclosed, besides an algorithm based on modular doublings and modular additions. An example circuit for Montgomery multiplication is also disclosed.

The example modular inversion algorithm disclosed herein is a reversible implementation of the Montgomery inverse via the binary extended Euclidean (binary GCD) algorithm. To realize this algorithm as a circuit, tools that can be adapted for other reversible algorithms are also disclosed.

An example quantum circuit for elliptic curve point addition in affine coordinates and example methods for using it to implement scalar multiplication to be used in Shor's algorithm.

Embodiments implementing all of the above algorithms in F# within the framework of the quantum computing software toolsuite LIQUi|⟩ (e.g., for real-world parameters of up to 521 bits).

Derived from the example implementations, concrete resource estimates are presented for the total number of qubits, the number of Toffoli gates and the depth of the Toffoli gate networks to realize Shor's algorithm and its subroutines.

Results. An example implementation as disclosed herein realizes a reversible circuit for controlled elliptic curve point addition on an elliptic curve defined over a field of prime order with n bits and needs at most $9n+2\lceil\log_2(n)\rceil+10$ qubits. An interpolation of the data points for the number of Toffoli gates shows that the quantum circuit can be implemented with at most roughly $256n^2 \log_2(n)+1786n^2$ Toffoli gates. For Shor's full algorithm, the point addition is desirably run $2n$ times sequentially and does not need additional qubits. The overall number of Toffoli gates is thus about $512n^3 \log_2(n)+3572n^3$. For example, an example simulation of the point addition quantum circuit for the NIST standardized curve P-256 needs 2330 logical qubits and the full Shor algorithm would need about $1.26 \cdot 10^{11}$ Toffoli gates. In comparison, Shor's factoring algorithm for a 3072-bit modulus needs 6146 qubits and $1.5 \cdot 10^{14}$ Toffoli gates (these estimates are interpolated from the results in Thomas Haner, Martin Roetteler, and Krysta M. Svore, "Factoring using $2n+2$ qubits with Toffoli based modular multiplication," arXiv preprint arXiv:1611.07995 (2016)), which confirms results by Proos and Zalka showing that it is easier to break ECC than RSA at comparable classical security.

The estimates provide a data point that allows a better understanding of the requirements to run Shor's quantum ECDLP algorithm and they can serve as a basis to make better predictions about the time horizon until which elliptic curve cryptography can still be considered secure. Besides helping to gain a better understanding of the post-quantum (in-) security of elliptic curve cryptosystems, the reversible algorithms (and their LIQUi|⟩ implementations) for modular arithmetic and the elliptic curve group law can be used as building blocks for other quantum algorithms.

3 Elliptic Curves and Shor's Algorithm

This section provides some background on elliptic curves over finite fields, the elliptic curve discrete logarithm problem (ECDLP) and Shor's quantum algorithm to solve the ECDLP. Throughout, the discussion is restricted to the case of curves defined over prime fields of large characteristic.

3.1 Elliptic Curves and the ECDLP

Let $p>3$ be a prime. Denote by $\mathbb{F}_p$ the finite field with p elements. An elliptic curve over $\mathbb{F}_p$ is a projective, non-singular curve of genus 1 with a specified base point. It can be given by an affine Weierstrass model; it can be viewed as the set of all solutions $(x, y)$ to the equation $E: y^2 = x^3 + ax + b$ with two curve constants $a, b \in \mathbb{F}_p$, together with a point at infinity $\mathcal{O}$. The set of $\mathbb{F}_p$-rational points consists of $\mathcal{O}$ and all solutions $(x, y) \in \mathbb{F}_p \times \mathbb{F}_p$ and is denoted by $E(\mathbb{F}_p) = \{(x, y) \in \mathbb{F}_p \times \mathbb{F}_p | y^2 = x^3 + ax + b\} \cup \{\mathcal{O}\}$. The set $E(\mathbb{F}_p)$ is an abelian group with respect to a group operation "+" that is defined via rational functions in the point coordinates with $\mathcal{O}$ as the neutral element. Similarly, for a field extension $\mathbb{F} \supseteq \mathbb{F}_p$, one similarly defines the group of $\mathbb{F}$-rational points $E(\mathbb{F})$ and if $\mathbb{F}$ is an algebraic closure of $\mathbb{F}_p$, we simply denote $E = E(\mathbb{F})$. For an extensive treatment of elliptic curves, see we refer the reader to J. H. Silverman, "The Arithmetic of Elliptic Curves (2nd Edition)," Number 106 in Graduate texts in mathematics (Springer-Verlag, 2009).

The elliptic curve group law on an affine Weierstrass curve can be computed as follows. Let $P_1, P_2 \in E$ and let $P_3 = P_1 + P_2$. If $P_1 = \mathcal{O}$ then $P_3 = P_2$ and if $P_2 = \mathcal{O}$, then $P_3 = P_1$. Now let $P_1 \neq \mathcal{O} \neq P_2$ and write $P_1 = (x_1, y_1)$ and $P_2 = (x_2, y_2)$ for $x_1, y_1, x_2, y_2 \in \mathbb{F}$. If $P_2 = -P_1$, then $x_1 = x_2$, $y_2 = -y_1$ and $P_3 = \mathcal{O}$. If neither of the previous cases occurs, then $P_3 = (x_3, y_3)$ is an affine point and can be computed as $$x_3 = \lambda^2 - x_1 - x_2, \quad y_3 = (x_1 - x_3)\lambda - y_1,$$

where $$\lambda = \frac{y_2 - y_1}{x_2 - x_1}$$

if $P_1 \neq P_2$, i.e. $x_1 \neq x_2$, and $$\lambda = \frac{3x_1^2 + a}{2y_1}$$

if $P_1 = P_2$. For a positive integer m, denote by $[m]P$ the m-fold sum of P, i.e. $[m]P = P + \ldots + P$, where P occurs m times. Extended to all $m \in \mathbb{Z}$ by $[0]P = \mathcal{O}$ and $[-m]P = [m](-P)$, the map $[m]: E \to E$, $P \mapsto [m]P$ is called the multiplication-by-m map or simply scalar multiplication by m. Scalar multiplication (or group exponentiation in the multiplicative setting) is one of the main ingredients for discrete-logarithm-based cryptographic protocols. It is also an essential operation in Shor's ECDLP algorithm. The order $\text{ord}(P)$ of a point P is the smallest positive integer r such that $[r]P = \mathcal{O}$.

Curves that are most widely used in cryptography are defined over large prime fields. One works in a cyclic subgroup of $E(\mathbb{F}_p)$ of large prime order r, where $\#E(\mathbb{F}_p) = h \cdot r$. The group order can be written as $\#E(\mathbb{F}_p) = p + 1 - t$, where t is called the trace of Frobenius and the Hasse bound ensures that $|t| \leq 2\sqrt{p}$. Thus $\#E(\mathbb{F}_p)$ and p are of roughly the same size. The most efficient instantiations of ECC are achieved for small cofactors h. For example, the above mentioned NIST curves have prime order (h=1) and Curve 25519 has cofactor h=8. Let $P \in E(\mathbb{F}_p)$ be an $\mathbb{F}_p$-rational point on E of order r and let $Q \in \langle P \rangle$ be an element of the cyclic subgroup generated by P. The Elliptic Curve Discrete Logarithm Problem (ECDLP) is the problem to find the integer $m \in \mathbb{Z}/r\mathbb{Z}$ such that $$Q = [m]P.$$

The bit security of an elliptic curve is estimated by extrapolating the runtime of the most efficient algorithms for the ECDLP.

The currently best known classical algorithms to solve the ECDLP are based on parallelized versions of Pollard's rho algorithm. See John M. Pollard, "Monte Carlo methods for index computation mod p," Math. Comput., 32(143):918-924 (1978); Paul C. van Oorschot and Michael J. Wiener, "Parallel collision search with cryptanalytic applications," J. Cryptology, 12(1):1-28 (1999); John M. Pollard, "Kangaroos, Monopoly and discrete logarithms," J. Cryptology, 13(4):437-447 (2000). When working in a group of order n, the expected running time for solving a single ECDLP is ($\sqrt{\pi/2}+o(1)$) $\sqrt{n}$ group operations based on the birthday paradox. This is exponential in the input size log(n).

3.2 Shor's Quantum Algorithm for Solving the ECDLP

In Peter W. Shor, "Algorithms for quantum computation: Discrete logarithms and factoring," in 35th Annual Symposium on Foundations of Computer Science, Santa Fe, N. Mex., USA, 20-22 Nov. 1994, pages 124-134 (IEEE Computer Society, 1994), Shor presented two polynomial time quantum algorithms, one for factoring integers, the other for computing discrete logarithms in finite fields. The second one can naturally be applied for computing discrete logarithms in the group of points on an elliptic curve defined over a finite field.

Here, an instance of the ECDLP as described above is given. Let P∈E($\mathbb{F}_p$) be a fixed generator of a cyclic subgroup of E($\mathbb{F}_p$) of known order ord(P)=r, let Q∈⟨P⟩ be a fixed element in the subgroup generated by P; the goal is to find the unique integer m∈{1, . . . , r} such that Q=[m]P. Shor's algorithm proceeds as follows. First, two registers of length n+1 qubits (Hasse's bound guarantees that the order of P can be represented with n+1 bits) are created and each qubit is initialized in the |0⟩ state. Then a Hadamard transform H is applied to each qubit, resulting in the state $$\frac{1}{2^{n+1}} \sum_{k,l=0}^{2^{n+1}-1} |k, l\rangle.$$

Next, conditioned on the content of the register holding the label k or l, one can add the corresponding multiple of P and Q, respectively, and one can implement the map $$\frac{1}{2^{n+1}} \sum_{k,l=0}^{2^{n+1}-1} |k, l\rangle \mapsto \frac{1}{2^{n+1}} \sum_{k,l=0}^{2^{n+1}-1} |k, l\rangle |[k]P + [l]Q\rangle.$$

Hereafter, the third register is discarded and a quantum Fourier transform QFT$_{2^{2 \cdot (n+1)}}$ on 2(n+1) qubits is computed. Finally, the state of the first two registers—which hold a total of 2(n+1) qubits—is measured. As shown in Peter W. Shor, "Polynomial-time algorithms for prime factorization and discrete logarithms on a quantum computer," SIAM J. Comput., 26(5):1484-1509 (October 1997), the discrete logarithm ni can be computed from this measurement data via classical post-processing. The corresponding quantum circuit is shown in FIG. 1. In particular, FIG. 1 is a schematic block diagram 100 of a circuit for using Shor's algorithm to compute the discrete logarithm in the subgroup of an elliptic curve generated by a point P. The input to the problem is a point Q, and the task is to find m∈{1, . . . , ord(P)} such that Q=[m]P. The circuit naturally decomposes into three parts, namely (i) the Hadamard layer on the left, (ii) a double scalar multiplication (in this figure implemented as a cascade of conditional point additions), and (iii) the quantum Fourier transform QFT and subsequent measurement in the standard basis which is performed at the end.

Using Kitaev's phase estimation framework (see Michael A. Nielsen and Ike. L. Chuang, "Quantum Computation and Quantum Information," Cambridge University Press, Cambridge, UK (2000)), Beauregard obtained a quantum algorithm for factoring an integer N from a circuit that performs a conditional multiplication of the form x ↦ ax mod N, where a∈$\mathbb{Z}_N$ is a random constant integer modulo N. See Stephane Beauregard, "Circuit for Shor's algorithm using 2n+3 qubits," Quantum Info. Comput., 3(2):175-185 (March 2003). The circuit uses only 2n+3 qubits, where n is the bitlength of the integer to be factored. An implementation of this algorithm on 2n+2 qubits, using Toffoli-gate-based modular multiplication is described in Thomas Haner, Martin Roetteler, and Krysta M. Svore, "Factoring using 2n+2 qubits with Toffoli based modular multiplication," arXiv preprint arXiv:1611.07995 (2016). In analogy to this algorithm, one can modify Shor's ECDLP algorithm, resulting in the circuit shown in FIG. 2.

Figure 2:
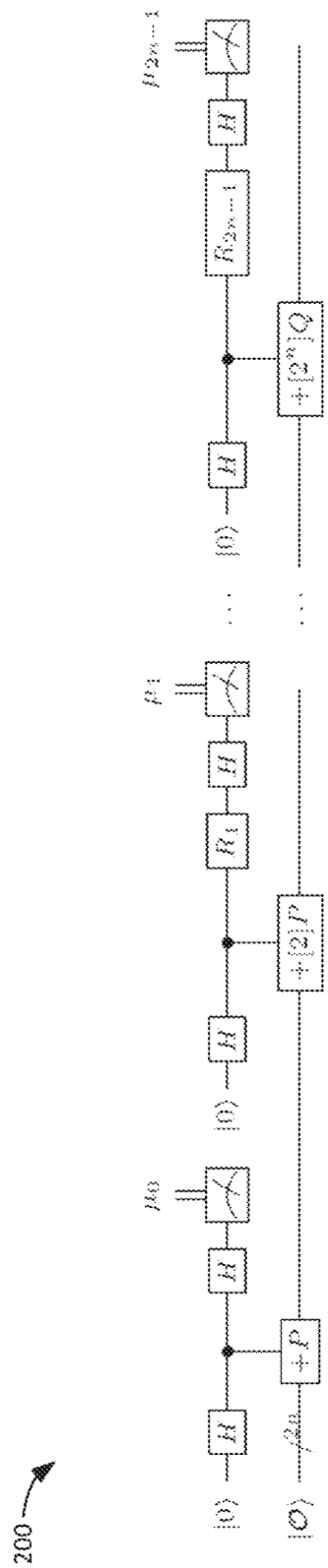
FIG. 2 is a schematic block diagram of an optimized circuit for using Shor's algorithm to compute the discrete logarithm in the subgroup of an elliptic curve generated by a point P.

More specifically, FIG. 2 is a schematic block diagram 200 of a circuit for using Shor's algorithm to compute the discrete logarithm in the subgroup of an elliptic curve generated by a point P. The gates $R_k$ are phase shift gates given by diag(1, $e^{i\theta_k}$), where $\theta_k = -\pi \sum_{j=0}^{k-1} 2^{k-j} \mu_j$ and the sum runs over all previous measurements j with outcome $\mu_j \in \{0, 1\}$. In contrast to the circuit in FIG. 1 only one additional qubit is needed besides qubits required to represent the elliptic curve points The phase shift matrices $$R_i = \begin{pmatrix} 1 & 0 \\ 0 & e^{i\theta_k} \end{pmatrix}, \quad \theta_k = -\pi \sum_{j=0}^{k-1} 2^{k-j} \mu_j,$$

depend on all previous measurement outcomes $\mu_j \in \{0, 1\}$, j∈{0, . . . , k−1}.

4 Reversible Modular Arithmetic

Shor's algorithm for factoring actually only requires modular multiplication of a quantum integer with classically known constants. In contrast, the elliptic curve discrete logarithm algorithm requires elliptic curve scalar multiplications to compute [k]P+[l]Q for a superposition of values for the scalars k and l. These scalar multiplications are comprised of elliptic curve point additions, which in turn comprise a sequence of modular operations on the coordinates of the elliptic curve points. This requires the implementation of full modular arithmetic, which means that one needs to add and multiply two integers held in quantum registers modulo the constant integer modulus p.

This section presents quantum circuits for reversible modular arithmetic on n-bit integers that are held in quantum registers. Circuit diagrams for the modular operations are also presented, in which black triangles on the right side of gate symbols indicate qubit registers that are modified and hold the result of the computation. Tools for implementing modular arithmetic are integer addition and bit shift operations on integers, which are described first.

4.1 Integer Addition and Binary Shifts

The algorithms for elliptic curve point addition as described below use integer addition and subtraction in different variants: standard integer addition and subtraction of two n-bit integers, addition and subtraction of a classical constant integer, as well as controlled versions of those.

For adding two integers, one can take the quantum circuit described by Yasuhiro Takahashi, Seiichiro Tani, and Noboru Kunihiro, "Quantum addition circuits and unbounded fan-out," Quantum Information and Computation, 10(9 and 10):872-890 (2010). The circuit works on two registers holding the input integers, the first of size n qubits and the second of size n+1 qubits. It operates in place—the contents of the second register are replaced to hold the sum of the inputs storing a possible carry bit in the additionally available qubit. To obtain a subtraction circuit, one can implement an inverse version of this circuit. The carry bit in this case indicates whether the result of the subtraction is negative. Controlled versions of these circuits can be obtained by using partial reflection symmetry to save controls, which compares favorable to a generic version where simply all gates are controlled. For the constant addition circuits, the algorithms described in Thomas Haner, Martin Roetteler, and Krysta M. Svore, "Factoring using 2n+2 qubits with Toffoli based modular multiplication," arXiv preprint arXiv:1611.07995 (2016) are used. Binary doubling and halving circuits are needed for the Montgomery multiplication and inversion algorithms. They are implemented essentially as cyclic bit shifts realized by sequences of symmetric bit swap operations built from CNOT gates.

4.2 Modular Addition and Doubling

Modular arithmetic will now be discussed. The circuit shown in schematic block diagram 300 of FIG. 3 computes a modular addition of two integers x and y held in n-qubit quantum registers $|x\rangle$ and $|y\rangle$, modulo the constant integer modulus p. It performs the operation in place $|x\rangle|y\rangle \mapsto |x\rangle|(x+y) \bmod p\rangle$ and replaces the second input with the result. It uses quantum circuits for plain integer addition and constant addition and subtraction of the modulus. It uses two auxiliary qubits, one of which is used as an ancilla qubit in the constant addition and subtraction and can be in an unknown state to which it will be returned at the end of the circuit. The other qubit stores the bit that determines whether a modular reduction in form of a modulus subtraction actually needs to be performed or not. It is uncomputed at the end by a strict comparison circuit between the result and the first input. Modular subtraction is implemented by reversing the circuit.

Figure 3:
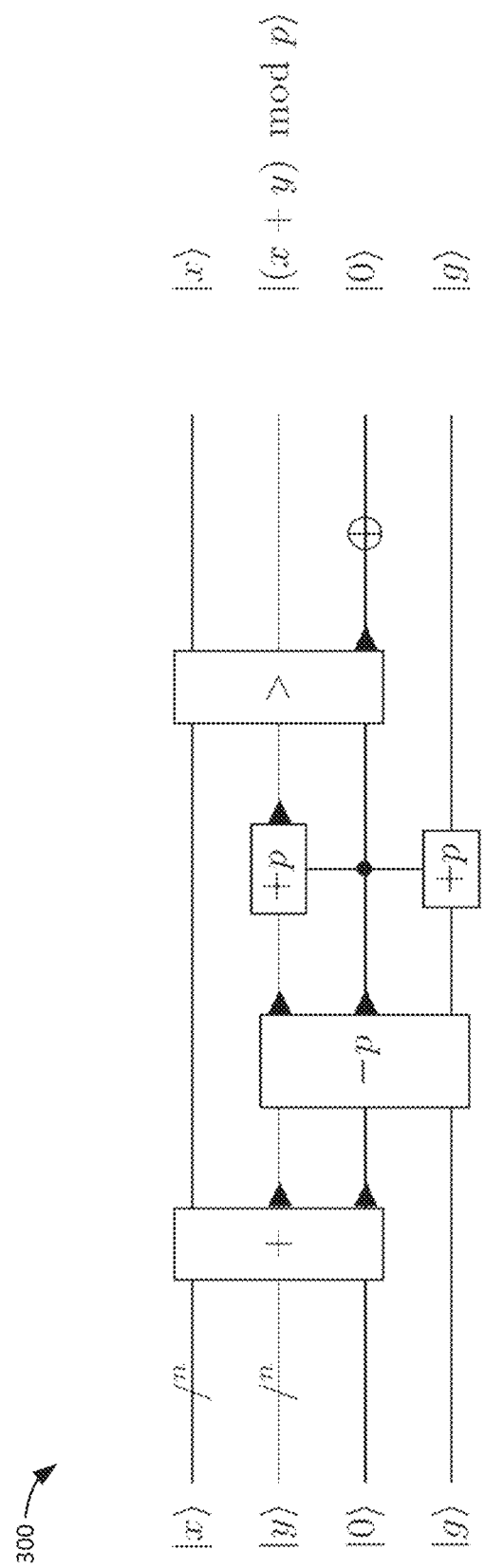
FIG. 3 is a schematic block diagram showing a quantum circuit for in-place modular addition $|x\rangle|y\rangle \mapsto |x\rangle|(x+y)\bmod p\rangle$.

More specifically, FIG. 3 is a schematic block diagram 300 showing a quantum circuit for in-place modular addition $|x\rangle|y\rangle \mapsto |x\rangle|(x+y) \bmod p\rangle$. The registers $|x\rangle$, $|y\rangle$ consist of n logical qubits each. The ancilla qubit $|c\rangle$ is a single logical qubit. The circuit uses integer addition +, addition +p and subtraction -p of the constant modulus p, and strict comparison of two n-bit integers in the registers $|x\rangle$ and $|y\rangle$, where the output bit flips the carry qubit in the last register. The constant adders use an ancilla qubit in an unknown state $|g\rangle$, which is returned to the same state at the end of the circuit. To implement controlled modular addition ctrl_add_modp, one simply controls all operations in this circuit.

Figure 4:
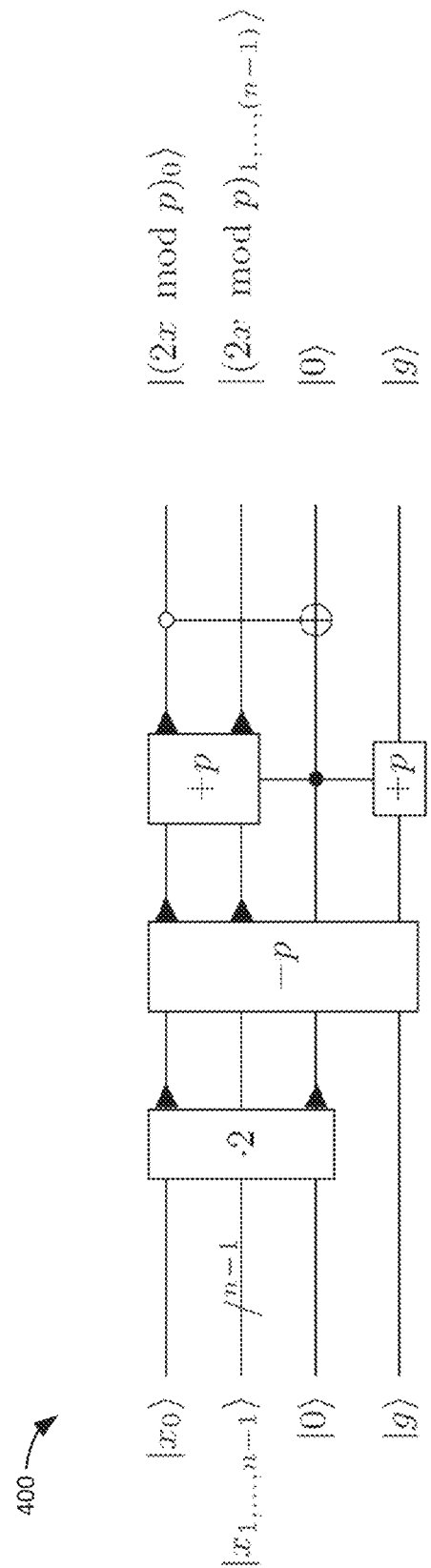
FIG. 4 is a schematic block diagram showing a modular doubling circuit for a constant odd integer modulus p.

FIG. 4 is a schematic block diagram 400 showing a modular doubling circuit for a constant odd integer modulus p that follows the same principle. There are two changes that make it more efficient than the addition circuit. First of all it works in place on only one n-qubit input integer $|x\rangle$, it computes $|x\rangle \mapsto |2x \bmod p\rangle$. Therefore it uses only n+2 qubits. The first integer addition in the modular adder circuit is replaced by a more efficient multiplication by 2 implemented via a cyclic bit shift as described in the previous subsection. Since one can assume that the modulus p is odd in this circuit, the auxiliary reduction qubit can be uncomputed by checking whether the least significant bit of the result is 0 or 1. A subtraction of the modulus has taken place if, and only if this bit is 1.

More specifically, FIG. 4 is a schematic block diagram 400 of a quantum circuit for in-place modular doubling $|x\rangle \mapsto |2x \bmod p\rangle$ for an odd constant modulus p. The registers $|x\rangle$ consists of n logical qubits, the circuit diagram represents the least significant bit separately. The circuit uses a binary doubling operation ·2 and addition +p and subtraction -p of the constant modulus p. The constant adders use an ancilla qubit in an unknown state $|g\rangle$, which is returned to the same state at the end of the circuit.

For adding a classical constant to a quantum register modulo a classical constant modulus, one can use the in-place modular addition circuit described in Section II of Thomas Haner, Martin Roetteler, and Krysta M. Svore, "Factoring using 2n+2 qubits with Toffoli based modular multiplication," arXiv preprint arXiv:1611.07995 (2016). The circuit operates on the n-bit input and requires only 1 ancilla qubit initialized in the state $|0\rangle$ and n-1 dirty ancillas that are given in an unknown state and will be returned in the same state at the end of the computation.

4.3 Modular Multiplication

Figure 5:
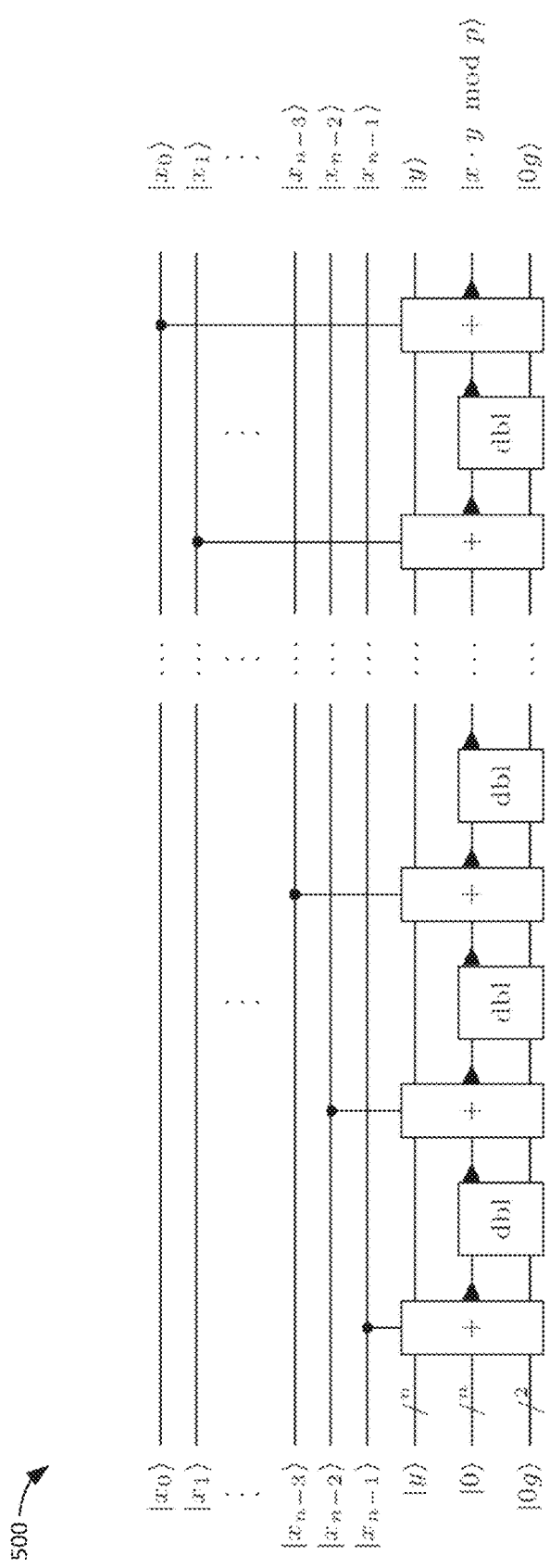
FIG. 5 is a schematic block diagram showing a circuit that computes the product $z=x\cdot y \bmod p$ for constant modulus p by using an expansion of the product along a binary decomposition of the first multiplicand.

Multiplication by Modular Doubling and Addition. Modular multiplication can be computed by repeated modular doublings and conditional modular additions. FIG. 5 is a schematic block diagram 500 showing a circuit that computes the product z=x·y mod p for constant modulus p as described by Proos and Zalka by using a simple expansion of the product along a binary decomposition of the first multiplicand, i.e.

$$x \cdot y = \sum_{i=0}^{n-1} x_i 2^i \cdot y = x_0 y + 2(x_1 y + 2(x_2 y + \ldots + 2(x_{n-2} y + 2(x_{n-1} y)) \ldots )).$$

The circuit runs on 3n+2 qubits, 2n of which are used to store the inputs, n to accumulate the result and 2 ancilla qubits are needed for the modular addition and doubling operations, one of which can be dirty. The latter could be taken to be one of the $x_i$, for example $x_0$ except in the last step, when the modular addition gate is conditioned on $x_0$. For simplicity, one can assume it to be a separate qubit.

More specifically, FIG. 5 is a schematic block diagram 500 showing a quantum circuit for modular multiplication $|x\rangle|y\rangle|0\rangle \mapsto |x\rangle|y\rangle|x \cdot y \bmod p\rangle$ built from modular doublings dbl←dbl_modp and controlled modular additions +←ctrl_add_modp. The registers $|x_i\rangle$ hold single logical qubits, $|y\rangle$ and $|0\rangle$ hold n logical qubits. The two ancilla qubits $|0g\rangle$ are the ones needed in the modular addition and doubling circuits, the second one can be in an unknown state to which it will be returned.

Figure 6:
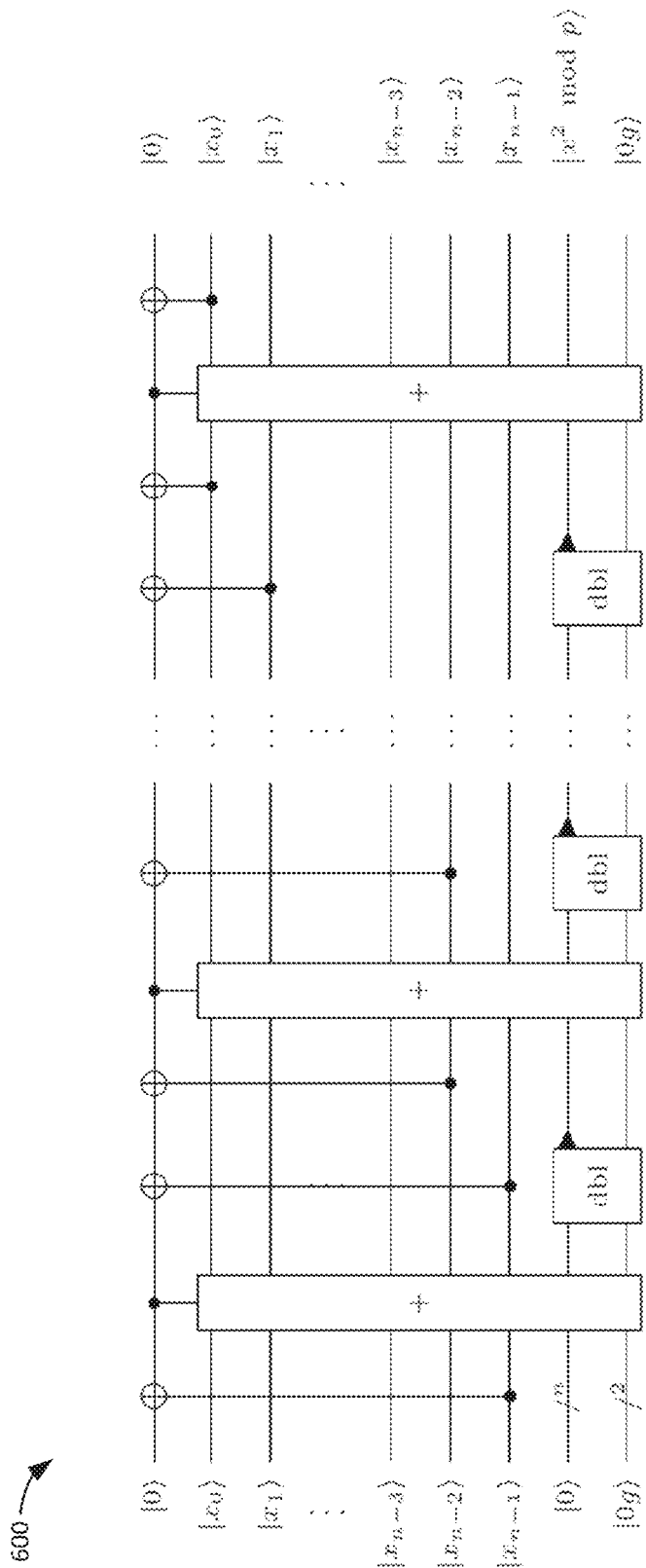
FIG. 6 is a schematic block diagram showing a quantum circuit for the corresponding specialization to compute a square $z=x^2 \bmod p$.

FIG. 6 is a schematic block diagram 600 showing a quantum circuit for the corresponding specialization to compute a square z=$x^2$ mod p. It uses 2n+3 qubits by removing the n qubits for the second input multiplicand, and adding one ancilla qubit, which is used in round i to copy out the current bit $x_i$ of the input in order to add x to the accumulator conditioned on the value of $x_i$.

More specifically, FIG. 6 is a schematic block diagram 600 showing a quantum circuit for modular squaring $|x\rangle|0\rangle \mapsto |x\rangle|x^2 \bmod p\rangle$ built from modular doublings dbl←dbl_modp and controlled modular additions +←ctrl_add_modp. The registers $|x_i\rangle$ hold single logical qubits, $|0\rangle$ holds n logical qubits. The two ancilla qubits $|0g\rangle$ are the ones needed in the modular addition and doubling circuits, the second one can be in an unknown state to which it will be returned.

Montgomery Multiplication In classical applications, Montgomery multiplication is often the most efficient choice for modular multiplication if the modulus does not have a special shape such as being close to a power of 2. See Peter L. Montgomery, "Modular multiplication without trial division," Mathematics of Computation, 44(170):519-521 (1985). This section explores Montgomery multiplication as an alternative to the algorithm using modular doubling and addition as described above.

In Peter L. Montgomery, "Modular multiplication without trial division," Mathematics of Computation, 44(170):519-521 (1985), Montgomery introduced a representation for an integer modulo p he called a p-residue that is now called the Montgomery representation. Let R be an integer radix coprime to p. An integer a modulo p is represented by the Montgomery representation aR mod p. The Montgomery reduction algorithm takes as input an integer 0≤c<Rp and computes $cR^{-1}$ mod p. Thus given two integers aR mod p and bR mod p in Montgomery representation, applying the Montgomery reduction to their product yields the Montgomery representation (ab)R mod p of the product. If R is a power of 2, one can interleave the Montgomery reduction with school-book multiplication, obtaining a combined Montgomery multiplication algorithm. The division operations usually needed for computing remainders are replaced by binary shifts in each round of the multiplication algorithm.

The multiplication circuit using modular doubling and addition operations described in the previous subsection contains two modular reductions in each round of the algorithm. Each of those is realized here by at least two integer additions. In contrast, the Montgomery algorithm circuit shown in schematic block diagram 700 of FIG. 7 avoids these and uses only one integer addition per round. This reduces the circuit depth in comparison to the double-and-add approach. However, it comes at the cost of requiring more qubits. The main issue is that the algorithm stores the information for each round, whether the odd modulus p had to be added to the intermediate result to make it even or not. This is done to allow divisions by 2 through a simple bit shift of an even number. These bits are still set at the end of the circuit shown in FIG. 7. To uncompute these values, one can copy the result to another n-qubit register, and run the algorithm backwards, which essentially doubles the depth of the algorithm. But this still leads to a lower overall depth than the one of the double-and-add algorithm. Hence, switching to Montgomery multiplication presents a trade-off between the required number of qubits and the multiplication circuit depth.

The same optimization as shown in the previous section allows to save n−1 qubits when implementing a Montgomery squaring circuit that computes $z=x^2$ mod p.

Figure 7:
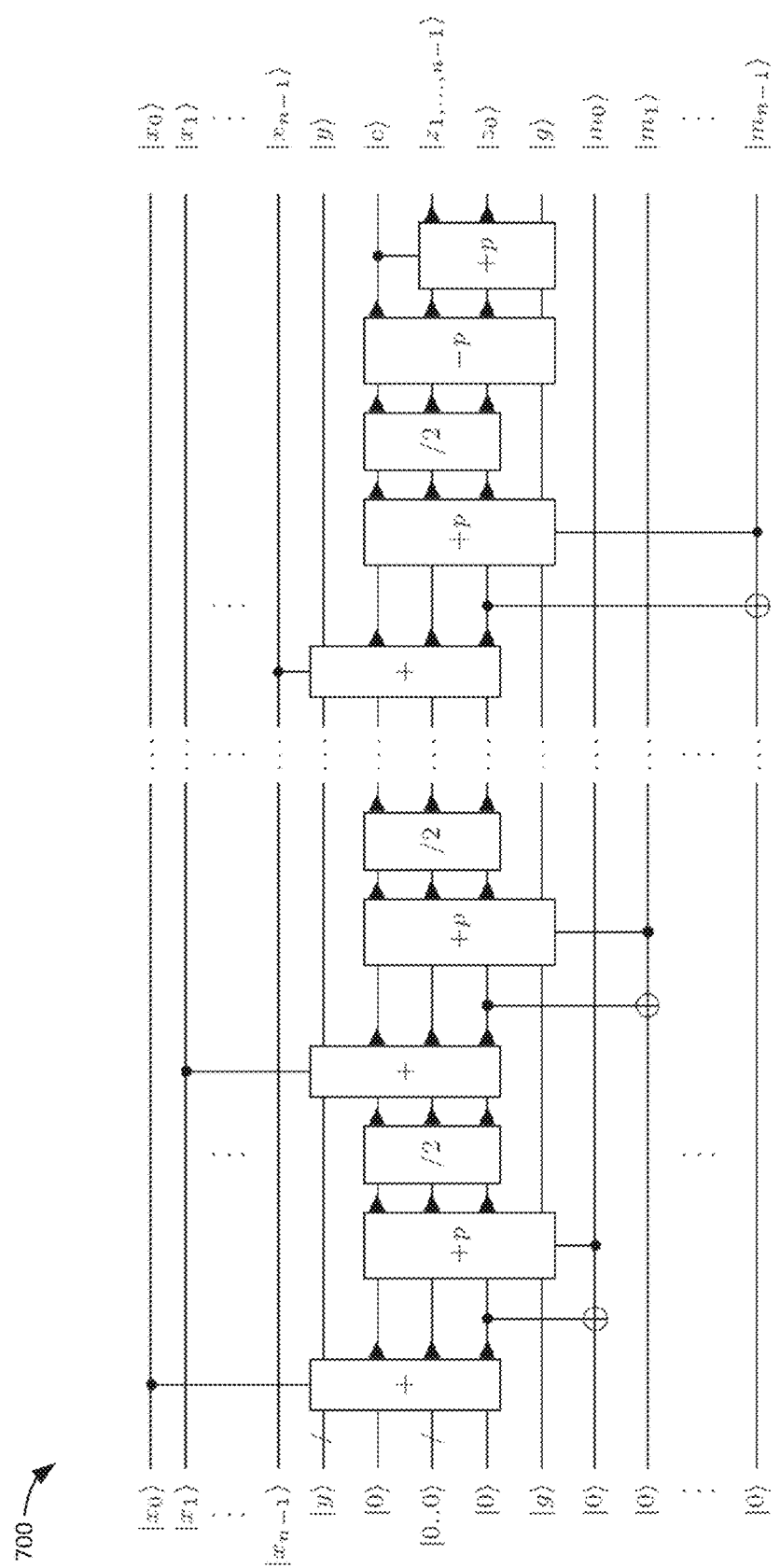
FIG. 7 is a schematic block diagram showing quantum circuit for the forward Montgomery modular multiplication $|x\rangle|y\rangle|0\rangle \mapsto |x\rangle|y\rangle|z=x\cdot y \bmod p\rangle$.

More specifically, FIG. 7 is a schematic block diagram 700 showing quantum circuit for the forward Montgomery modular multiplication $|x\rangle|y\rangle|0\rangle \mapsto |x\rangle|y\rangle|z=x\cdot y \bmod p\rangle$. The register $|y\rangle$ holds n logical qubits and $|0 \ldots 0\rangle$ holds n−1. All others are single qubits. The qubit $|g\rangle$ is a dirty ancilla qubit in an unknown state. The qubit labelled $|m_i\rangle$ holds the information whether the intermediate result in round i was odd and thus whether p was added to it. The circuit uses integer addition +, integer addition +p and subtraction −p of the constant modulus p and a halving circuit /2 that performs a cyclic qubit shift. The last two gates reflect the standard conditional subtraction of p. To uncompute the qubits $|m_i\rangle$, one copies out the result z and runs the circuit backwards.

4.4 Modular Inversion

Performing the modular inversion on a quantum computer is by far the most costly operation required in order to implement the affine group law of an elliptic curve. In some embodiments, a reversible circuit is used for the extended binary greatest common divisor algorithm that implements Kaliski's algorithm for inverting a number xR mod p given in Montgomery representation for $R=2^n$; an algorithm (i) which only uses elementary reversible operations such as Toffoli gates, (ii) whose sequence of instructions does not depend on the given input $x2^n$ mod p, and (iii) whose output is again in Montgomery form $x^{-1} 2^n$ mod p. See J. Stein, Journal of Computational Physics, 1(3):397-405 (1967); Burton S. Kaliski Jr, "The Montgomery inverse and its applications," IEEE Trans. Computers 44(8):1064-1065 (1995).

In certain embodiments, the extended binary GCD algorithm is used to compute the representation of the gcd between x and p, with the added requirement to ensure property (ii), namely to make sure that the sequence of operations that carries out the Euclidean algorithm is the same, independent of x. In particular, an issue is that for different inputs x≠x' the usual, irreversible Euclidean algorithm can terminate in a different number of steps. To fix this, a counter register which is incremented upon termination of the loop can be included to ensure the algorithm is run for 2n rounds, which is the worst-case runtime.

In the following algorithm to compute the Montgomery inverse the inputs are a prime p and a value x where 0≤x<p. The output is $x^{-1}2^n$ mod p. In functional programming style (here, using F# syntax), Kaliski's algorithm is described as follows:

let *MGinverse* p x = let *rec xmg u v r s k* = match *u, v, r, s* with

| | |
|---|---|
| \| _, 0, r, _ | −> r |
| \| u, _, _, _ when u \% 2 = 0 | −> *xmg* (u >>> 1) v r (s << 1) (k + 1) |
| \| _, v, _, _ when v \% 2 = 0 | −> *xmg* u (v >>> 1) (r << 1) (k + 1) |
| \| u, v, _, d when u > v | −> *xmg* ((u − v) >>> 1) v (r + s) (s << 1) (k + 1) |
| \| _, _, _, _ | −> *xmg* u ((v − u) >>> 1) (r << 1) (r + s) (k + 1) |

*xmg* p x 0 1 0

The algorithm actually computes only the so-called "almost inverse" which is of the form $x^{-1}2^k$; there is a secondary step necessary to convert to the correct form (not shown here). Two example executions 800, 802 are shown in FIGS. 8A and 8B.

In particular, FIGS. 8A and 8B show two example runs 800 and 802 of the reversible extended binary Euclidean algorithm to compute the Montgomery inverse modulo p=11. Shown in FIG. 8A is the execution for input x=8 which leads to termination of the usual irreversible algorithm after k=7 steps. The algorithm is always executed for 2n rounds, where n is the bit-size of p which is an upper bound on the maximum number of steps required for general input x. Once the final step v=0 has been reached, a counter register l is incremented. Shown in FIG. 8B is the execution for input x=7 which leads to termination after 5 steps after which the counter is incremented three times.

Figure 8:
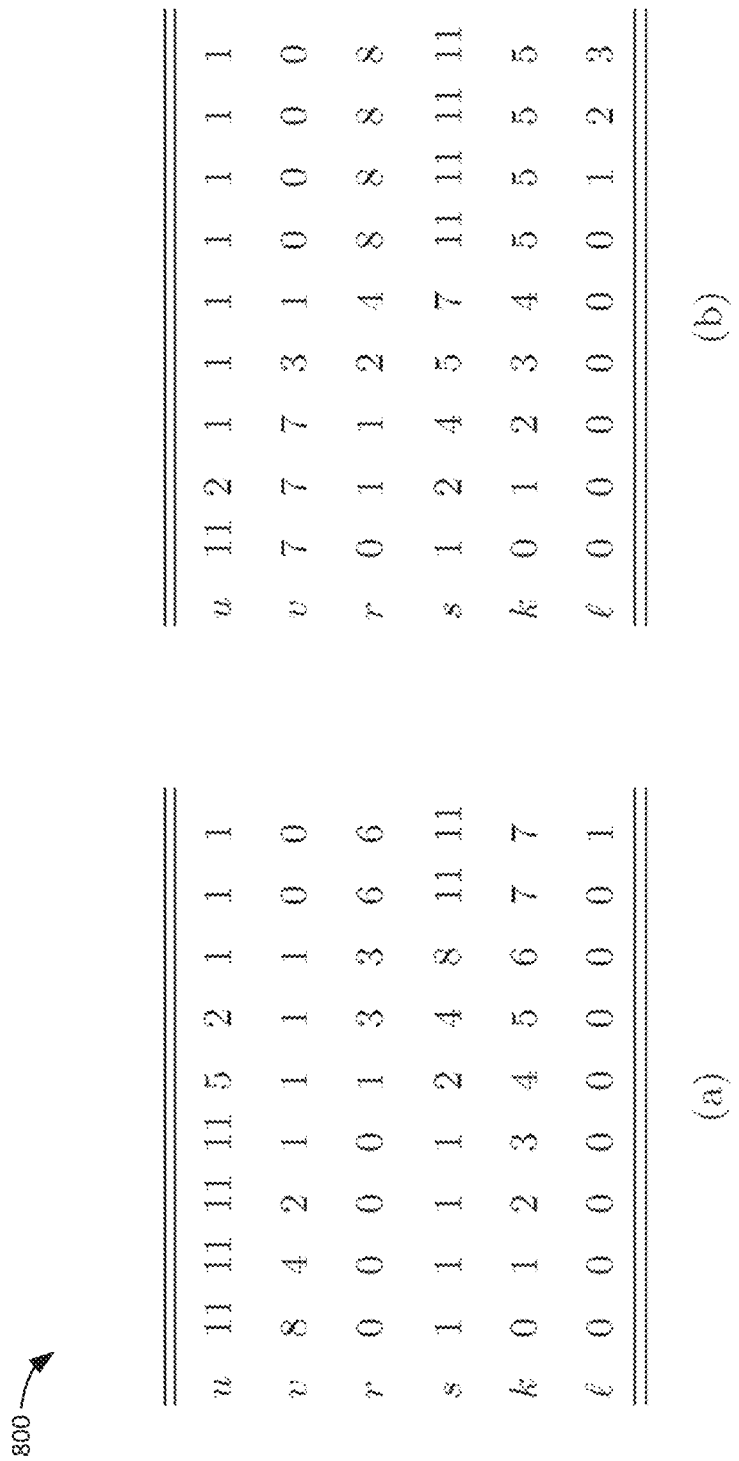
FIG. 8 shows two example executions of the so-called "almost inverse" technique to compute the modular inverse using the classical Kaliski algorithm.

As shown in FIG. 8, the actual number of steps that need to be executed until the gcd is obtained, depends on the actual input x: in the first example the usual Kaliski algorithm terminates after k=7 steps, whereas in the second example the usual algorithm would terminate after k=5 steps. To make the algorithm reversible, an implementation that carries out the same operations, irrespective of the input is desirable. The two main ingredients to obtain such an implementation are a) an upper bound of 2n steps that Kaliski's algorithm can take in the worst case and b) the introduction of a counter that ensures that either the computation is propagated forward or, in case the usual Kaliski algorithm has terminated, the counter is incremented. Such as counter can be implemented using $O(\log(n))$ qubits.

Figure 9A:
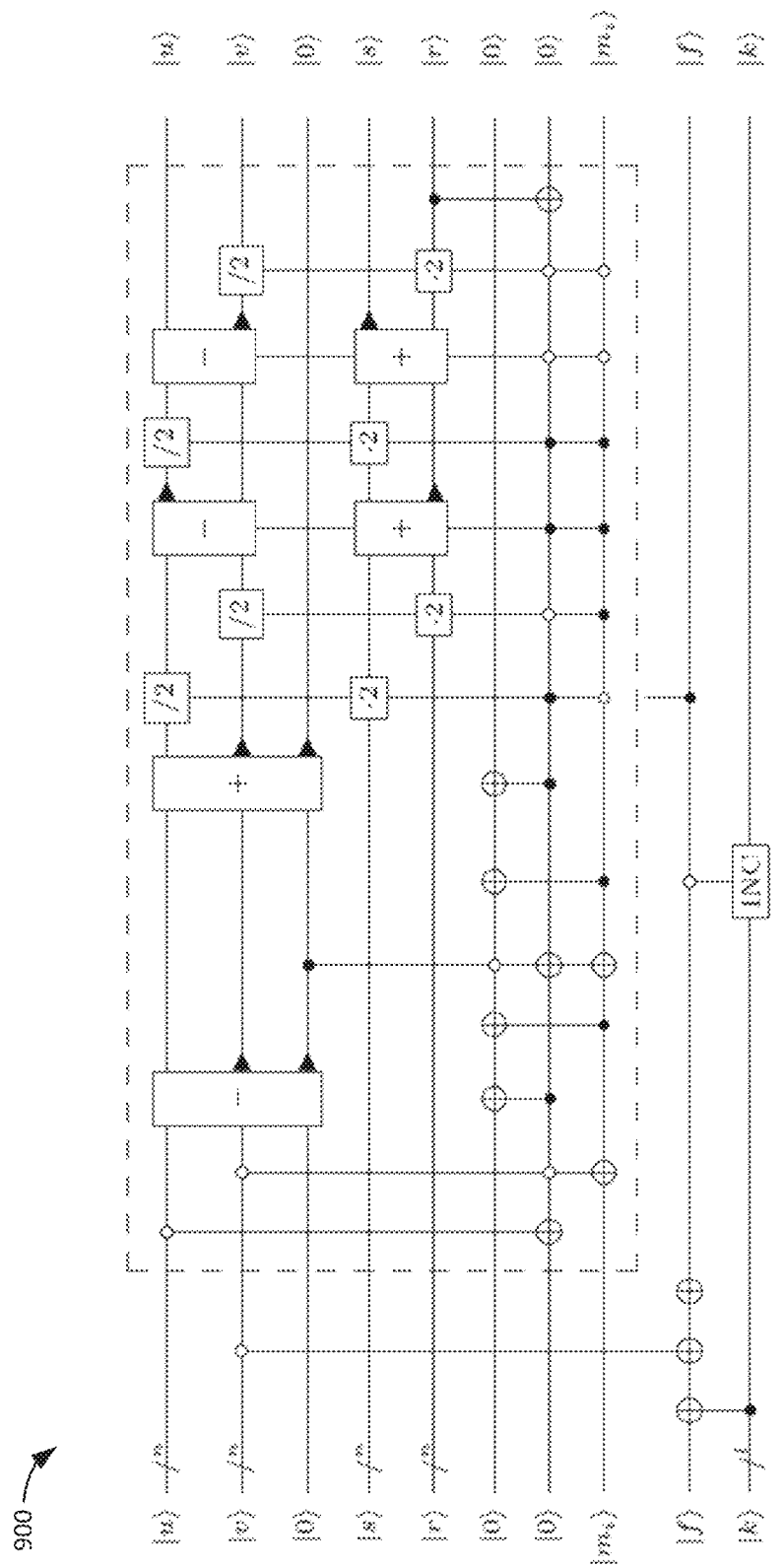
FIGS. 9A and 9B are schematic block diagrams showing an example of a circuit performing the Kaliski algorithm in a reversible fashion.
Figure 9B:
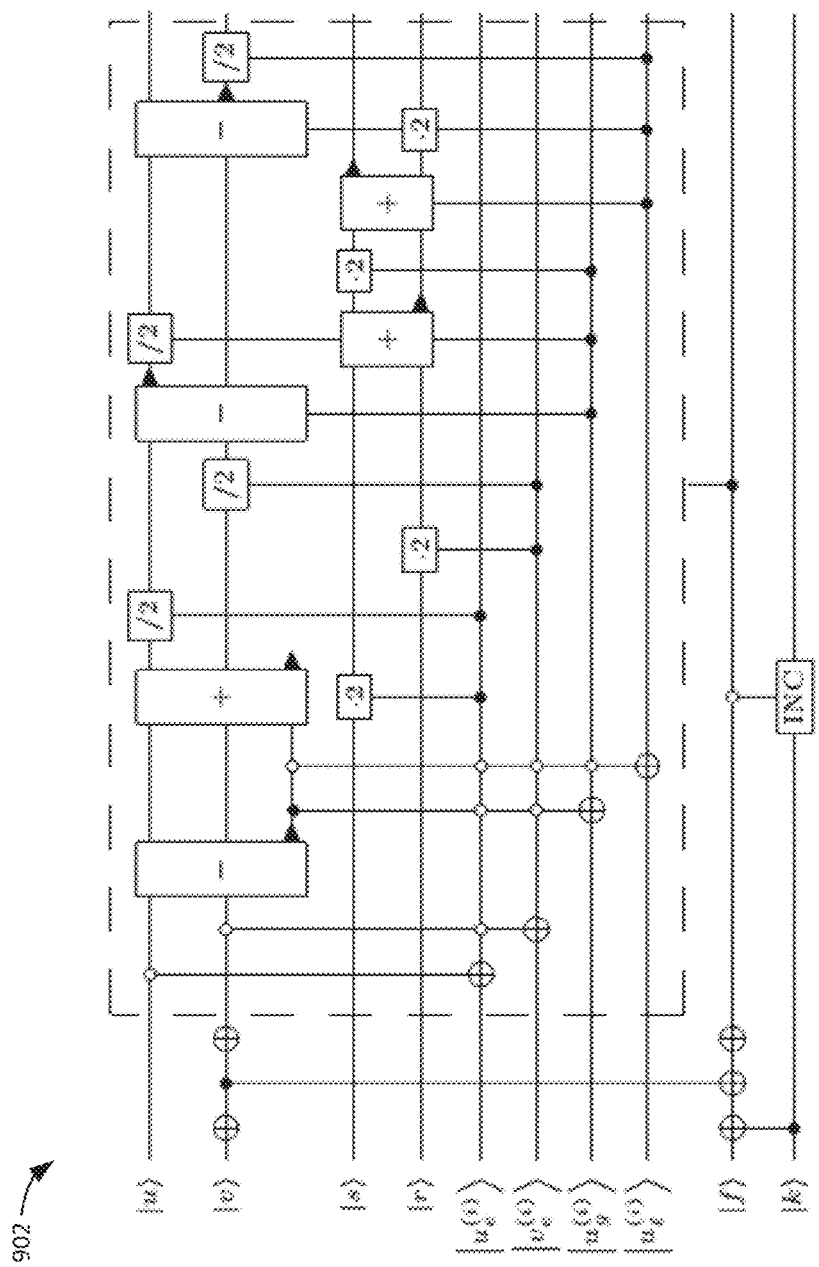

The circuit shown in schematic block diagram 900 of FIG. 9A implements the Kaliski algorithm in a reversible fashion. In particular, FIG. 9A is a schematic block diagram 900 of a quantum circuit for the Montgomery-Kaliski round function. The function is repeated 2n times to obtain a reversible modular inversion algorithm. The n-qubit registers $|u\rangle$, $|v\rangle$, $|r\rangle$, $|s\rangle$ represent the usual coefficients in the binary Euclidean algorithm. The circuit uses integer subtraction − and addition +, as well as multiplication and division by 2 functions ·2 and /2 and an incrementer circuit INC. The circuits ·2 and /2 are implemented as cyclic qubit shifts. (FIG. 9B is a schematic block diagram 902 showing another circuit for performing the operation in a slightly more space inefficient manner.)

An explanation of the various registers used in this circuit and of why this algorithm actually computes the same output as the Kaliski algorithm will now be provided. The algorithm uses n-bit registers for inputs u and v, where u is initially set to the underlying prime p. As p is constant can be prepared using bit flips corresponding to the binary representation of p. Moreover, v is initially set to the input x of which one would like to compute the inverse. Moving downward from the top, the next line represents a single ancilla qubit which is used to store an intermediate value which is the result of a comparison. Next, is an n+1-bit register for r and likewise an n+1-bit register for s, so that the loop invariant p=ru+sv holds at each stage of the algorithm. Eventually, when v=0 is reached, register r will hold the almost inverse and register s will be equal to p. The next 2 lines represent ancilla qubits which are used as scratch space to store an intermediate computation. The technically most interesting part is the next register which consists of a single qubit labeled $m_i$. This indicates that in round i, where $1 \leq i \leq 2n$ a fresh qubit is introduced, then acted upon by the circuit and then kept around.

After the maximum number of 2n rounds is executed, hence 2n qubits have been introduced and entangled in this way. The purpose of the qubit $m_i$ is to remember which of the 4 branches in Kaliski's algorithm was taken in step i. As there are 4 branches, this choice could be naively encoded into 2 qubits, which however would lead to a space overhead of 4n instead of 2n. The fact that one of these two qubits is actually redundant is shown in Lemma 1 below.

The next qubit, labeled f in the figure, is part of a mechanism to unroll the entire algorithm which drives precisely one of two processes forward: either the Kaliski algorithm itself, or a counter, here represented as the "INC" operation. The flag f starts out in state 1 which indicates that the algorithm is in Kaliski-mode. Once the terminating condition v=0 is reached, the flag switches to 0, indicating that the algorithm is in counter-mode. Finally, the register k holds the state of the counter. As the counter can take values between n and 2n only, it can be implemented using $\lceil \log_2(n)+1 \rceil$ qubits only.

Having covered all registers that are part of the circuit, it will now be explained how the circuit is actually unraveled to compute the almost inverse. FIG. 9A shows one round. The circuit is applied over and over to the same set of qubit registers, with the sole exception of qubit $m_i$ which depends on round i and which is initialized, acted upon, and then stored. In each round there are 4 possible branches. These are dispatched using the gates inside the dashed box. The first gate is a controlled NOT that acts only on the least significant bit of u, checking whether u is even. The next gate does the same for v, which flips the target bit in case u was odd and v was even. If both u and v are odd, the difference u−v respectively v−u has to be computed, depending on whether u>v or u≤v. To figure out which case actually holds, a subtractor is used and the most significant qubit in the mentioned ancilla is stored.

The sequence of 5 gates underneath the two subtractor/adders blocks serves as a encoder that prepares the following correspondence: '10' for case u even, '01' for case u odd, v even, '11' for case both odd and u>v, and '00' for case both odd and u≤v. With the two bits involved in this encoding denoted as 'ab', one can see that b is the round qubit $m_i$. The fact that a can be immediately uncomputed is a consequence of the following lemma.

Lemma 1. In each step of Kaliski's algorithm, precisely one of r and s is even and the other is odd. If the updated value of r is even, then the branch must have either from the case v even or the case in which both u and v are odd and u≤v. Correspondingly, if the updated value of r is odd, then the branch must have been other from the case u even or the case in which both u and v are odd and u>v.

Proof. An even value of r arises only from the mentioned two branches v even or u and v both odd and u≤v. Similarly, the other statement is obtained for s. The invariant p=ru+sv implies inductively that precisely one of r and s is even and the other henceforth must be odd. This implies the lemma.

Coming back to the dashed circuit, the next block of 6 gates is to dispatch the appropriate case, depending on the 2 bits a and b which corresponds to the 4 branches in the match statement. Finally, the last CNOT gate between the least significant bit of r (indicating whether r is even) is used to uncompute 'a'.

The illustrated circuit is then applied precisely 2n times. At this juncture, the computation of the almost inverse will have stopped after k steps where n≤k≤2n and the counter INC will have been advanced precisely 2n−k times. The counter INC could be implemented using a simple increment x ↦ x+1, however in our implementation we chose a finite state machine that has a transition function requiring less Toffoli gates.

Next, the register r which is known to hold $-x^{-1}2^k$ is converted to $x^{-1}2^n$. This is done by performing precisely n−k controlled modular doublings and a sign flip. Finally, the result is copied out into another register and the entire circuit is run backwards.

5 Reversible Elliptic Curve Operations

Based on the reversible algorithms for modular arithmetic from the previous section, implementing a reversible algorithm for adding two points on an elliptic curve will now be discussed. Further, a reversible point addition in the generic case will be described in which none of the exceptional cases of the simple affine Weierstrass group law occurs. After that, a reversible algorithm for computing a scalar multiplication [m]P will be described.

5.1 Point Addition

The reversible point addition implemented in example embodiments described herein use affine coordinates. Further, it is enough to consider the generic case of an addition. This means that one can assume the following situation. Let $P_1$, $P_2 \in E(\mathbb{F}_p)$, $P_1$, $P_2 \neq \mathcal{O}$ such that $P_1=(x_1, y_1)$ and $P_2=(x_2, y_2)$. Furthermore let $x_1 \neq x_2$ which means that $P_1 \neq \pm P_2$. Recall that then $P_3=P_1+P_2 \neq \mathcal{O}$ and it is given by $P_3=(x_3, y_3)$, where $x_3=\lambda^2-x_1-x_2$ and $y_3=\lambda(x_1-x_3)+y_1$ for $\lambda=(y_1-y_2)/(x_1-x_2)$.

As explained in Proos and Zalka, for computing the sum $P_3$ reversibly and in place (replacing the input point $P_1$ by the sum), the algorithm makes essential use of the fact that the slope $\lambda$ can be re-computed from the result $P_3$ via the point addition $P_3+(-P_2)$ independent of $P_1$ using the equation $$\frac{y_1 - y_2}{x_1 - x_2} = -\frac{y_3 + y_2}{x_3 - x_2}.$$

Algorithm 1 depicts an example algorithm for computing a controlled point addition. As input it takes the four point coordinates for $P_1$ and $P_2$, a control bit ctrl, and replaces the coordinates holding $P_1$ with the result $P_3=(x_3, y_3)$. Note that we assume $P_2$ to be a constant point that has been classically precomputed, because we compute scalar multiples of the input points P and Q to Shor's algorithm by conditionally adding together precomputed 2-power multiples of these points as shown in FIG. 1 above. The point $P_2$ will thus always be one of these values. Therefore, operations involving the coordinates $x_2$ and $y_2$ are implemented as constant operations. Algorithm 1 uses two additional temporary variables $\lambda$ and $t_0$. All the point coordinates and the temporary variables fit in n-bit registers and thus the algorithm can be implemented with a circuit on a quantum register $|x_1\, y_1\, \text{ctrl}\, \lambda\, t_0\, \text{tmp}\rangle$, where the register tmp holds auxiliary registers that are needed by the modular arithmetic operations used in Algorithm 1 as described in Section 4.

The algorithm is given as a straight line program of (controlled) arithmetic operations on the point coefficients and auxiliary variables. The comments at the end of the line after each operation show the current values held in the variable that is possibly changed. The notation $[\cdot]_1$ shows the value of the variable in case the control bit is ctrl=1, if it is ctrl=0 instead, the value is shown with $[\cdot]_0$. In the latter case, it is easy to check that the algorithm indeed returns the original state of the register.

The functions in the algorithm all use the fact that the modulus p is known as a classical constant. They relate to the algorithms described in Section 4 as follows:

add_const_modp is a modular addition of a constant from a quantum state, sub_const_modp is its reverse, a modular subtraction of a constant.

ctrl_add_const_modp is single qubit controlled modular addition of a constant to a qubit register, i.e. the controlled version of the above. Its reverse is the controlled modular subtraction ctrl_sub_const_modp.

ctrl_sub_modp is a single qubit controlled modular subtraction on two qubit registers, implemented as the reverse of the corresponding modular addition.

ctrl_neg_modp is a single qubit controlled modular negation on a qubit register.

mul_modp, squ_modp, inv_modp are the out-of-place modular multiplication, squaring and inversion algorithms on two input qubit registers, respectively.

Figure 10:
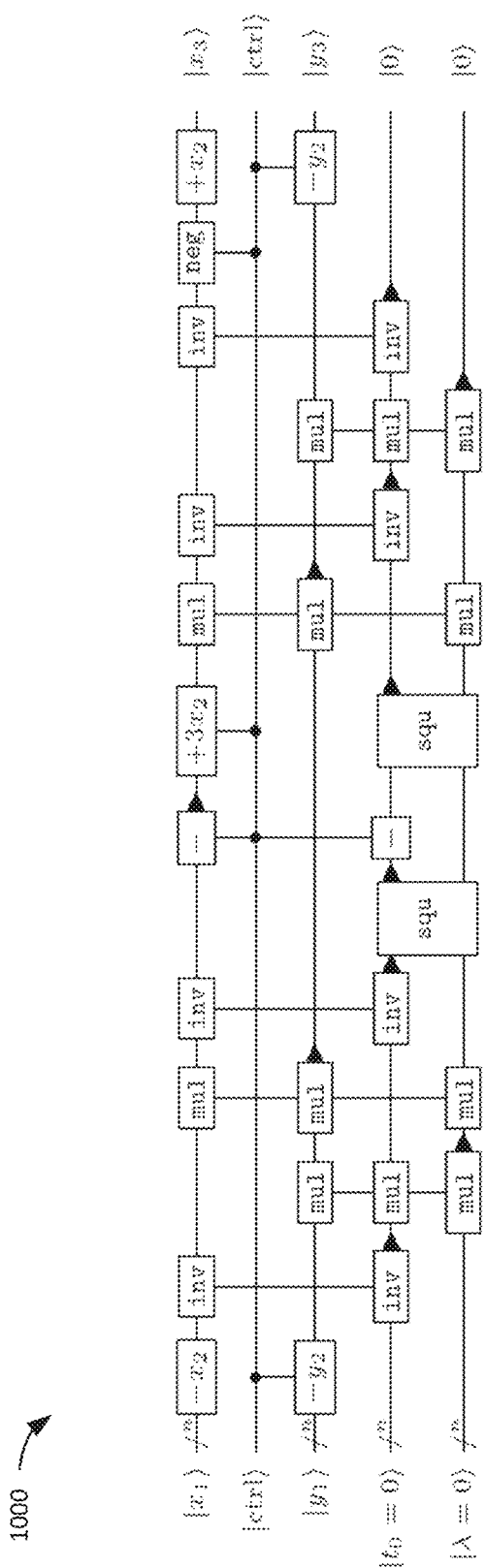
FIG. 10 is a schematic block diagram showing a quantum circuit for controlled elliptic curve point addition.

FIG. 10 is a schematic block diagram 1000 showing a quantum circuit that implements Algorithm 1. The quantum registers $|x_1\rangle$, $|y_1\rangle$, $|t_0\rangle$, $|\lambda\rangle$ all comprise n logical qubits, whereas $|\text{ctrl}\rangle$ is a single logical qubit. For simplicity in the circuit diagram, we do not show the register $|\text{tmp}\rangle$ with the auxiliary qubits. These qubits are used as needed by the modular arithmetic operations and are returned to their original state after each operation. The largest amount of ancilla qubits is needed by the modular inversion algorithm, which determines that we require 5n qubits in the register $|\text{tmp}\rangle$. To avoid permuting the wires between gates, we have used a split gate notation for some modular operations. For all gates, the black triangles mark the output wire that contains the result. As described in Section 4, addition and subtraction gates carry out their operations in place, meaning that one of the input registers is overwritten with the result. Modular multiplication, squaring and inversion operate out of place and store the result in a separate output register.

More specifically, FIG. 10 is a schematic block diagram 1000 showing a quantum circuit for controlled elliptic curve point addition. All operations are modulo p and we use the abbreviations +←add_modp, −←sub_modp, mul←mul_modp, squ←squ_modp, inv←inv_modp.

Remark 1. (Projective coordinates) As can be seen from Section 4, modular inversion is by far the most complex and resource consuming part of the elliptic curve point addition. The need for computing and uncomputing the slope $\lambda$ leads to four calls to the inversion in Algorithm 1.

Unsurprisingly, this situation resembles the one for classical modular arithmetic. For example, in elliptic curve cryptography, a modular inversion can be two orders of magnitudes more costly than a modular multiplication, depending on the specific prime field. A significant speed-up

---

Algorithm 1 Reversible, controlled elliptic curve point addition. This algorithm operates on a quantum register holding the point $P_1 = (x_1, y_1)$, a control bit ctrl, and two auxiliary values $\lambda$ and $t_0$. In addition it needs auxiliary registers for the functions that are called as described for those functions. The second point $P_2 = (x_2, y_2)$ is assumed to be a precomputed classical constant. For $P_1, P_2 \neq \mathcal{O}, P_1 \neq \pm P_2$, if ctrl = 1, the algorithm correctly computes $P_1 \leftarrow P_1 + P_2$ in the register holding $P_1$; if ctrl = 0 it returns the register in the same state as it was received.

1: sub_const_modp $x_1\, x_2$;        // $x_1 \leftarrow x_1 - x_2$
2: ctrl_sub_const_modp $y_1\, y_2$ ctrl;   // $y_1 \leftarrow [y_1 - y_2]_1, [y_1]_0$
3: inv_modp $x_1\, t_0$;            // $t_0 \leftarrow 1/(x_1 - x_2)t$ -continued Algorithm 1 Reversible, controlled elliptic curve point addition. This algorithm operates on a quantum register holding the point $P_1 = (x_1, y_1)$, a control bit ctrl, and two auxiliary values $\lambda$ and $t_0$. In addition it needs auxiliary registers for the functions that are called as described for those functions. The second point $P_2 = (x_2, y_2)$ is assumed to be a precomputed classical constant. For $P_1, P_2 \neq \mathcal{O}, P_1 \neq \pm P_2$, if ctrl = 1, the algorithm correctly computes $P_1 \leftarrow P_1 + P_2$ in the register holding $P_1$; if ctrl = 0 it returns the register in the same state as it was received.

| | | |
|---|---|---|
| 4: | mul_modp $y_1$ $t_0$ $\lambda$; | // $\lambda \leftarrow \left[\frac{y_1 - y_2}{x_1 - x_2}\right]_1, \left[\frac{y_1}{x_1 - x_2}\right]_0$ |
| 5: | mul_modp $\lambda$ $x_1$ $y_1$; | // $y_1 \leftarrow 0$ |
| 6: | inv_modp $x_1$ $t_0$; | // $t_0 \leftarrow 0$ |
| 7: | squ_modp $\lambda$ $t_0$; | // $t_0 \leftarrow \lambda^2$ |
| 8: | ctrl_sub_modp $x_1$ $t_0$ ctrl; | // $x_1 \leftarrow [x_1 - x_2 - \lambda^2]_1, [x_1 - x_2]_0$ |
| 9: | ctrl_add_const_modp $x_1$ $3x_2$ ctrl; | // $x_1 \leftarrow [x_2 - x_3]_1, [x_1 - x_2]_0$ |
| 10: | squ_modp $\lambda$ $t_0$; | // $t_0 \leftarrow 0$ |
| 11: | mul_modp $\lambda$ $x_1$ $y_1$; | // $y_1 \leftarrow [y_3 + y_2]_1, [y_1]_0$ |
| 12: | inv_modp $x_1$ $t_0$; | // $t_0 \leftarrow \left[\frac{1}{x_2 - x_3}\right]_1, \left[\frac{1}{x_1 - x_2}\right]_0$ |
| 13: | mul_modp $t_0$ $y_1$ $\lambda$; | // $\lambda \leftarrow 0$ |
| 14: | inv_modp $x_1$ $t_0$; | // $t_0 \leftarrow 0$ |
| 15: | ctrl_neg_modp $x_1$ ctrl; | // $x_1 \leftarrow [x_3 - x_2]_1, [x_1 - x_2]_0$ |
| 16: | ctrl_sub_const_modp $y_1$ $y_2$ ctrl; | // $y_1 \leftarrow [y_3]_1, [y_1]_0$ |
| 17: | add_const_modp $x_1$ $x_2$; | // $x_1 \leftarrow [x_3]_1, [x_1]_0$ | can be achieved by using some form of projective coordinates (a collection of possible coordinate systems and the corresponding formulas to carry out the group law is provided at https://www.hyperelliptic.org/EFD/.), which allow to avoid almost all modular inversions in cryptographic protocols by essentially multiplying through with all denominators. This comes at the relatively small cost of storing more coefficients and a moderate increase in addition and multiplication operations and has proved highly effective. It is thus a natural question to ask whether the use of projective coordinates can also make Shor's algorithm more efficient.

There are several obstacles that make it non-trivial to use projective coordinates for quantum algorithms, such as the fact that each point is represented by an equivalence class of coordinate vectors and the increased number of temporary variables, which need to be uncomputed.

5.2 Scalar Multiplication

In order to compute a scalar multiplication [m]P of a known base point P, one can also follow the approach outlined Proos and Zalka. Namely, by classically precomputing all n 2-power multiples of P, the scalar multiple can be computed by a sequence of n controlled additions of those constant points to an accumulator in a quantum register along the binary representation of the scalar. Namely, let $m = \sum_{i=0}^{n-1} m_i 2^i$, $m_i \in \{0, 1\}$, be the binary representation of the n-bit scalar m. Then, $$[m]P = \left[\sum_{i=0}^{n-1} m_i 2^i\right] P = \sum_{i=0}^{n-1} m_i([2^i]P).$$

This has the advantage that all doubling operations can be carried out on a classical computer and the quantum circuit only requires the generic point addition, which simplifies the overall implementation.

Proos and Zalka say that on average, for any addition step, the probability of an exceptional case is negligibly low, and hence this will only have a negligible influence on the fidelity of the algorithm. To prevent the addition with the point at infinity in the first step, they suggest to initialize the register with a non-zero multiple of the point P. For the purpose of estimating resources for Shor's algorithm, one can follow the approach by Proos and Zalka and only consider the generic group law. A detailed examination of this approach is provided next.

Counting Scalars with Exceptional Cases. As explained in Section 3, Shor's algorithm involves generating a superposition over all possible pairs of (n+1)-bit strings k and l, e.g., the state $$\frac{1}{2^{n+1}} \sum_{k,l=0}^{2^{n+1}-1} |k, l\rangle.$$

Then over this superposition, involving two additional n-qubit registers to hold an elliptic curve point, one computes a double scalar multiplication $$\frac{1}{2^{n+1}} \sum_{k,l=0}^{2^{n+1}-1} |k, l\rangle |[k]P + [l]Q\rangle$$

of the input points given by the ECDLP instance.

FIG. 1 depicts the additional elliptic curve point register to be initialized with a representation of the neutral element $\mathcal{O}$. But if one only considers the generic case of the group law, the first addition of P would already involve an exceptional case due to one of the inputs being $\mathcal{O}$. Proos and Zalka propose to solve this issue by instead initializing the register with a uniform random non-zero multiple of P, say [a]P for a random $a \in \{1, 2, \ldots, r-1\}$. Recall that r is the order of P which we assume to be a large prime. Now, if $a \notin \{1, r-1\}$, the first point addition with P works as a generic point addition. With high probability, this solves the issue of an exception in the first addition, but still exceptions occur along the way for many of the possibilities for bit strings k and l. Whenever a bit string leads to an exceptional case in the group law, it produces a wrong result for the double scalar multiplication and pollutes the quantum register. One can call such a scalar invalid. For Shor's algorithm to work, the overall number of such invalid scalars must be small enough. In the following, one can count these scalars to confirm the reasoning in Proos and Zalka.

Exceptional Additions of a Point to Itself. Let $a \in \{1, 2, \ldots, r-1\}$ be fixed and write $k = \sum_{i=0}^{n} k_i 2^i$, $k_i \in \{0, 1\}$. One can first consider the exceptional case in which both input points are the same, which can be called an exceptional doubling. If $a=1$, this occurs in the first iteration for $k_0=1$, because one attempts to add P to itself. This means that for $a=1$, all scalars k with $k_0=1$ lead to a wrong result and therefore half of the scalars are invalid, i.e. in total $2^n$.

For $a=2$, the case $k_0=1$ is not a problem since the addition $[2]P+P$ is a generic addition, but $(k_0, k_1)=(0, 1)$ leads to an exceptional doubling operation in the second controlled addition. This means that all scalars $(0, 1, k_2, \ldots, k_n)$ are invalid. These are one quarter of all scalars, i.e. $2^{n-1}$.

For general a, assume that k is a scalar such that the first i−1 additions, $i \in \{1, \ldots, n\}$, controlled on the bits $k_0, \ldots, k_{i-1}$ do not encounter any exceptional doubling cases. The i-th addition means the addition of $[2^i]P$ for $0 \leq i \leq n$. Then the i-th addition is an exceptional doubling if, and only if $$a + (k_0 + k_1 \cdot 2 + \ldots + k_{i-1} \cdot 2^{i-1}) = 2^i \pmod{r}.$$

If i is such that $2^i < r$. Then, the above condition is equivalent to the condition $a = 2^i - \sum_{j=0}^{i-1} k_j \cdot 2^j$ over the integers. This means that an a can only lead to an exceptional doubling in the i-th addition if $a \in \{1, \ldots, 2^i\}$. Furthermore, if i is the smallest integer, such that there exist $k_0, \ldots, k_{i-1}$ such that this equation holds, one can conclude that $a \in \{2^{i-1}+1, \ldots, 2^i\}$ and $k_{i-1}=0$. In that case, any scalar of the form $(k_0, \ldots, k_{i-2}, 0, 1, *, \ldots, *)$ is invalid. The number of such scalars is $2^{n-i}$.

If i is instead such that $2^i \geq r$ and if $a \leq 2^i - \mu r$ for some positive integer $\mu \leq \lfloor 2^i/r \rfloor$, then in addition to the solutions given by the equation over the integers as above, there exist additional solutions given given by the condition $a = (2^i - \mu r) - \sum_{j=0}^{i-1} k_j \cdot 2^j$, namely $(k_0, \ldots, k_{i-1}, 1, *, \ldots, *)$. The maximal number of such scalars is $\lfloor (2^i - a)/r \rfloor 2^{n-i}$, though some of these may have been counted already.

For a given $a \in \{1, 2, \ldots, r-1\}$, denote by Sn the set of scalars that contain an exceptional doubling; the set of all $k = (k_0, k_1, \ldots, k_n) \in \{0, 1\}^{n+1}$ such that there occurs an exceptional doubling when executing the addition $[a + \sum_{j=0}^{i-1} k_j \cdot 2^j]P + [2^i]P$ for any $i \in \{0, 1, \ldots, n\}$. Let $i_a = \lceil \log(a) \rceil$. Then, an upper bound for the number of invalid scalars is given by $$\#S_a \leq 2^{n-i_a} + \sum_{i=\lceil \log(r) \rceil}^{n} \lfloor (2^i - a)/r \rfloor 2^{n-i}.$$

Hasse's bound gives $\lceil \log(r) \rceil \geq n-1$, which means that $$\#S_a \leq 2^{n-i_a} + 2\lfloor (2^{n-1}-a)/r \rfloor + \lfloor (2^n - a)/r \rfloor \leq 2^{n-i_a} + 8.$$

Hence on average, the number of invalid scalars over a uniform choice of $k \in \{1, \ldots, r-1\}$ can be bounded as $$\sum_{a=1}^{r-1} Pr(a) \cdot \#S_a \leq \frac{1}{r-1} \sum_{a=1}^{r-1} 2^{n - \lceil \log(a) \rceil} + 8.$$

Grouping values of a with the same $\lceil \log(a) \rceil$ and possibly adding terms at the end of the sum, the first term can be simplified and further bounded by $$\frac{1}{r-1}(2^n + \lceil \log(r-1) \rceil 2^{n-1}) = (2 + \lceil \log(r-1) \rceil) \frac{2^{n-1}}{r-1}.$$

For large enough bitsizes, we use that $r-1 \geq 2^{n-1}$ and obtain the upper bound on the expected number of invalid scalars of roughly $\lceil \log(r) \rceil + 10 \approx n+10$. This corresponds to a negligible fraction of about $n/2^{n+1}$ of all scalars.

Exceptional Additions of a Point to its Negative. To determine the number of invalid scalars arising from the second possibility of exceptions, namely the addition of a point to its negative, one can carry out the same arguments. An invalid scalar is a scalar that leads to an addition $[-2^i]P + [2^i]P$. The condition on the scalar a is slightly changed with $2^i$ replaced by $r-2^i$:

$$a + (k_0 + k_1 \cdot 2 + \ldots + k_{i-1} \cdot 2^{i-1}) = r - 2^i \pmod{r}.$$

Whenever this equation holds over the integers, i.e. $r - a = 2^i + (k_0 + k_1 \cdot 2 + \ldots + k_{i-1} \cdot 2^{i-1})$ holds, one can argue analogously as above. If $2^i < r$ and $r - a \in \{2^i, \ldots, 2^{i+1}-1\}$, there are $2^{n-i}$ invalid scalars. Similar arguments as above for the steps such that $2^i > r$ lead to similar counts. Overall, one can conclude that in this case the fraction of invalid scalars can also be approximated by $n/2^{n+1}$.

Exceptional Additions of the Point at Infinity. Since the quantum register holding the elliptic curve point is initialized with a non-zero point and the multiples of P added during the scalar multiplication are also non-zero, the point at infinity can only occur as the result of an exceptional addition of a point to its negative. Therefore, all scalars for which this occurs have been excluded previously and one does not need to further consider this case.

Overall, an approximate upper bound for the fraction of invalid scalars among the superposition of all scalars due to exceptional cases in the addition law is $2n/2^{n+1} = n/2^n$.

Double Scalar Multiplication. In Shor's algorithm with the above modification, one needs to compute a double scalar multiplication $[a+k]P + [l]Q$ where P and Q are the points given by the ECDLP instance one is trying to solve and a is a fixed uniformly random non-zero integer modulo r. Here, the goal is trying to find the integer ni modulo r such that $Q = [m]P$. Since r is a large prime, one can assume that $m \in \{1, \ldots, r-1\}$ and can write $P = [m^{-1}]Q$. Multiplication by $m^{-1}$ on the elements modulo r is a bijection, simply permuting these scalars. Hence, after having dealt with the scalar multiplication to compute $[a+k]P$ above, one can now apply the same treatment to the second part, the addition of $[l]Q$ to this result.

Let a be chosen uniformly at random. For any k, one can write $[a+k]P = [m^{-1}(a+k)]Q$. Assume that k is a valid scalar for this fixed choice of a. Then, the computation of $[a+k]P$ did not involve any exceptional cases and thus $[a+k]P \neq \rangle$, which means that $a + k \neq 0 \pmod{r}$. If one assumes that the unknown discrete logarithm ni has been chosen from $\{1, \ldots, r-1\}$ uniformly at random, then the value $b = m^{-1}(a+k) \bmod r$ is uniform random in $\{1, \ldots, r-1\}$ as well, and one has the same situation as above when looking at the choice of a and the computation of [a+k]P.

Using the rough upper bound for the fraction of invalid scalars from above, for a fixed random choice of a, the probability that a random scalar k is valid, is at least $1-n/2^n$. Further, the probability that (k, l) is a pair of valid scalars for computing [a+k]P+[l]Q, conditioned on k being valid for computing [a+k]P is also at least $1-n/2^n$. Hence, for a fixed uniform random a, the probability for (k, l) being valid is at least $(1-n/2^n)^2 = 1-n/2^{n-1}+n^2/2^{2n} \approx 1-n/2^{n-1}$. This result confirms the rough estimate by Proos and Zalka of a fidelity loss of $4n/p \geq 4n/2^{n+1}$.

Remark 2. (Complete addition formulas) There exist complete formulas for the group law on an elliptic curve in Weierstrass form. See Wieb Bosma and Hendrik W. Lenstra, "Complete system of two addition laws for elliptic curves," Journal of Number Theory, 53(2):229-240 (1995). This means that there is a single formula that can evaluate the group law on any pair of $\mathbb{F}_p$-rational points on the curve and thus avoids the occurrence of exceptional cases altogether. For classical computations, this comes at the cost of a relatively small slowdown. Using such formulas would increase the algorithm's fidelity in comparison to the above method. Furthermore, there exist alternative curve models for elliptic curves which allow coordinate systems that offer even more efficient complete formulas. One such example is the twisted Edwards form of an elliptic curve. See Daniel J. Bernstein, Peter Birkner, Marc Joye, Tanja Lange, and Christiane Peters, "Twisted Edwards curves," in Serge Vaudenay, editor, Progress in Cryptology—AFRICACRYPT 2008, First International Conference on Cryptology in Africa, Casablanca, Morocco, Jun. 11-14, 2008, Proceedings, volume 5023 of Lecture Notes in Computer Science, pages 389-405 (Springer, 2008). However, not all elliptic curves allow a curve model in twisted Edwards form, like, for example, the prime order NIST curves.

6 Cost and Resource Estimates for Shor's Algorithm

An example reversible algorithm for elliptic curve point addition was implemented on elliptic curves E in short Weierstrass form defined over a prime field $\mathbb{F}_p$, where p has n bits, as shown in Algorithm 1 and FIG. 10 in Section 5 in F# within the quantum computing software toolsuite LIQUi| ⟩ This allowed for the testing and simulation of the circuit and all its components and the obtaining of precise counts of the number of qubits, the number of Toffoli gates and the Toffoli gate depth. Therefore, one does not have to rely on mere estimates obtained by pen-and-paper calculations. A higher confidence in the results can thus be gained. When implementing the algorithms in example embodiments, the emphasis was to minimize first the number of required logical qubits and second the Toffoli gate count.

Simulations and tests were performed for cryptographically relevant parameter sizes. For instance, simulations of the elliptic curve point addition circuit for curves over prime fields of size up to 521 bits were performed. For each case, the number of qubits required to implement the circuit and its size and depth in terms of Toffoli gates were computed.

Number of Logical Qubits. The number of logical qubits of the modular arithmetic circuits in the simulation that are needed in the elliptic curve point addition are given in Table 1. Each function is listed with its total required number of qubits and the number of ancilla qubits included in that number. All ancilla qubits are expected to be input in the state |0⟩ and are returned in that state, except for the circuits in the first two lines, which only require one such ancilla qubit and n−1 ancillas in an unknown state to which they will be returned. The addition, subtraction and negation circuits all work in place, such that one n-qubit input register is replaced with the result. The multiplication, squaring and inversion circuits require an n-qubit register with which the result of the computation is XOR-ed.

Although the modular multiplication circuit based on modular doubling and additions uses fewer qubits than Montgomery multiplication, the Montgomery approach was used to report the results of the experiments. Since the lower bound on the overall required number of qubits is dictated by the modular inversion circuit, neither multiplication approach adds qubit registers to the elliptic curve addition circuit since they can use ancilla qubits provided by the inversion algorithm. The Montgomery circuit is the better choice then because it reduces the number of Toffoli gates.

Because the maximum amount of qubits is used during an inversion operation, the overall number of logical qubits for the controlled elliptic curve point addition in the example simulation is $9n+2\lceil\log_2(n)\rceil+10$.

In addition to the $7n+2\lceil\log_2(n)\rceil+9$ used by the inversion, an additional qubit is used for the control qubit |ctrl⟩ of the overall operation and 2n more qubits are used since two n-qubit registers hold intermediate results during each inversion.

TABLE 1

Total number of qubits needed for the modular arithmetic circuits used in the elliptic curve point addition on E/$\mathbb{F}_p$, with n-bit prime p. The column labeled "ancilla" denotes the number of required ancilla qubits included in the total count. Except for the first two rows, they are expected to be input in state |0 . . . 0⟩ and are returned in that state. The circuits in the first two rows only need one such clean ancilla qubit and can take n − 1 dirty ancilla qubits in an unknown state to which they are returned.

| | # of qubits | |
|---|---|---|
| Modular arithmetic circuit | total | ancilla |
| add_const_modp, sub_const_modp | 2n | n |
| ctrl_add_const_modp, ctrl_sub_const_modp | 2n + 1 | n |
| ctrl_sub_modp | 2n + 4 | 3 |
| ctrl_neg_modp | n + 3 | 2 |
| mul_modp (dbl/add) | 3n + 2 | 2 |
| mul_modp (Montgomery) | 5n + 3 | 2n + 3 |
| squ_modp (dbl/add) | 2n + 3 | 3 |
| squ_modp (Montgomery) | 4n + 4 | 2n + 4 |
| inv_modp | $7n + 2\lceil\log_2(n)\rceil + 9$ | $5n + 2\lceil\log_2(n)\rceil + 9$ |

Figure 11:
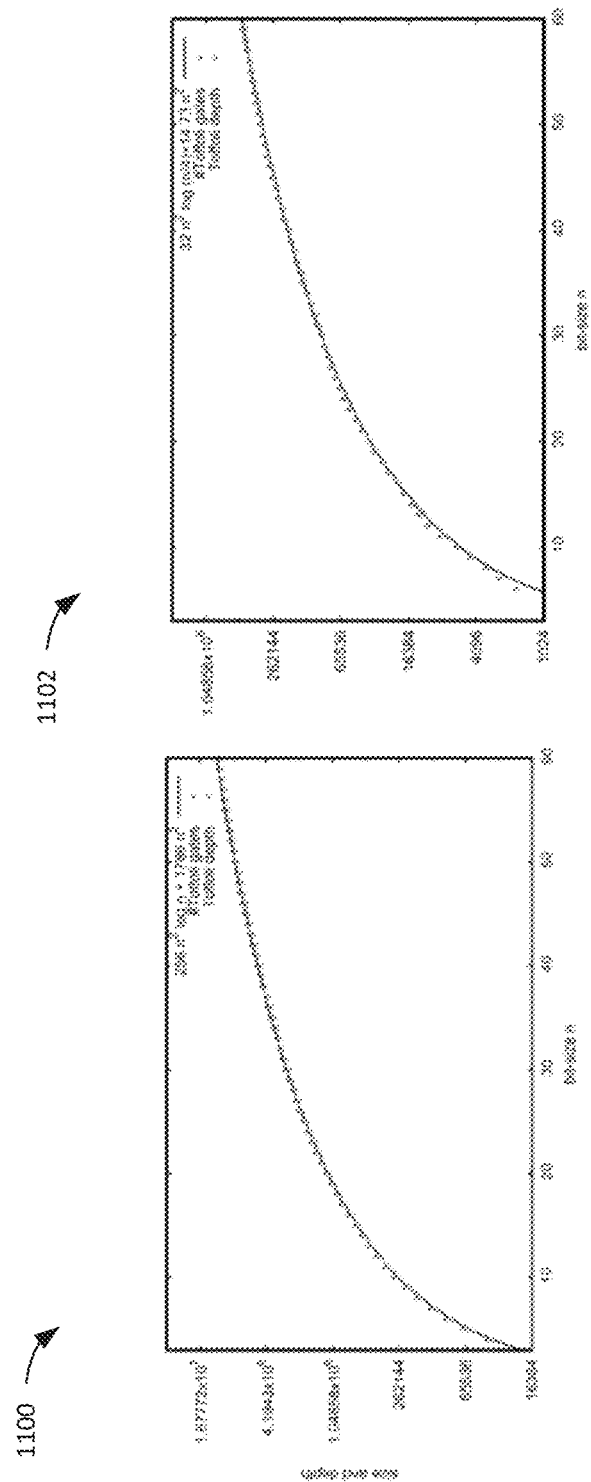
FIG. 11 shows graphs showing the scaling of the estimates for the Toffoli gate count and the Toffoli gate depth of the circuit for a range of relatively small bit sizes n.

Number of Toffoli Gates and Depth. FIG. 11 shows graphs 1100, 1102 showing the scaling of the estimates for the Toffoli gate count and the Toffoli gate depth of the circuit for a range of relatively small bit sizes n. The number of Toffoli gates in the point addition circuit scales as $256n^2 \log_2(n) + 1786n^2$. This closed formula has been determined by interpolation from simulation results. To estimate the overall resource requirements for Shor's algorithm, one simply multiplies by 2n, since the controlled point addition is iterated 2n times. This leads to the overall estimate for the scaling of the number of Toffoli gates in Shor's ECDLP algorithm as $(512 \log_2(n)+3572)n^3$.

In particular, FIG. 11 shows on the left (graph 1100) resource estimates for the number of Toffoli gates and the Toffoli gate depth for the implementation of elliptic curve point addition |P⟩ ↦ |P+Q⟩, where Q is a constant point.

Shown on the right (graph 1102) are resource estimates for the same metrics for modular multiplication $|x\rangle \mapsto |ax \bmod N\rangle$, where a and N are constants. Fitting the data for the elliptic curve case, one can obtain a scaling as $256n^2 \log_2(n)+1786n^2$ up to lower order terms. The cost for the entire Shor algorithm over the elliptic curve scales as 2n the cost for a single point addition $\sim 512n^3 \log_2(n)$ up to lower order terms. As shown in Thomas Haner, Martin Roetteler, and Krysta M. Svore, "Factoring using 2n+2 qubits with Toffoli based modular multiplication," arXiv preprint arXiv: 1611.07995 (2016), the cost for modular multiplication scales as $32n^2 (\log_2(n)-2)+14.73n^2$ and the cost of the entire Shor factoring algorithm scales as $64n^2 \log_2(n)$.

With respect to a given circuit, the Toffoli depth is computed as follows: one can sweep all gates in the circuits and keep a running counter for each qubit on which time step it was acted upon last by a Toffoli gate. The depth is then the maximum of these quantities over all qubits. As the number of qubits is comparatively small in the circuits considered here, one can keep performing these updates efficiently, leading to an algorithm to compute the depth in time linear in the number of gates in the circuit. Note that whenever one encounters a CNOT or NOT gate, one does not increase the counter as by assumption these gates do not contribute to the overall depth as they are Clifford gates. Overall, one finds that the circuit Toffoli depth is a little bit smaller than the total number of Toffoli gates, which shows that there is some parallelism in the circuit that can be exploited when implementing it on a quantum computer than facilitates parallel application of quantum gates.

This result can be compared to the corresponding simulation results for Shor's factoring algorithm presented in Thomas Haner, Martin Roetteler, and Krysta M. Svore, "Factoring using 2n+2 qubits with Toffoli based modular multiplication," arXiv preprint arXiv:1611.07995 (2016), where the corresponding function is modular constant multiplication. In this case, the number of Toffoli gates scales as $32n^2(\log_2(n)-2)+14.73n^2$, where n is the bitsize of the modulus to be factored. As above, to estimate the overall resource requirements, one again multiplies by 2n, which gives $(64(\log_2(n)-2)+29.46)n^3$.

Table 2 contains the resources required in simulated circuits for parameters of cryptographic magnitude that are used in practice. The simulation time only refers to our implementation of the elliptic curve group law. The simulation timings were measured when running a LIQUi| ⟩ implementation on an HP ProLiant DL580 Gen8 machine consisting of 4 Intel Xeon processors at 2.20 Ghz for a total of 40 cores and 3TB of memory.

Comparing to the theoretical estimates by Proos and Zalka, the results confirm the overall picture that for cryptographically relevant sizes, elliptic curve discrete logarithms can be computed more easily than a corresponding RSA modulus can be factored at a similar classical security level. However, neither the Toffoli gate counts for factoring from Thomas Haner, Martin Roetteler, and Krysta M. Svore, "Factoring using 2n+2 qubits with Toffoli-based modular multiplication," arXiv preprint arXiv:1611.07995 (2016), nor for elliptic curves here are as low as the theoretically predicted "time" estimates in Proos and Zalka. Also, the number of qubits in the simulation-based estimates is higher than the ones conjectured in Proos and Zalka.

TABLE 2

Resource estimates of Shor's algorithm for computing elliptic curve discrete logarithms in $E(\mathbb{F}_p)$ versus Shor's algorithm for factoring an RSA modulus N, stating the required number of qubits and number of Toffoli gates. The same row contains parameters that provide a similar classical security level according to NIST recommendations from 2016. Resource estimates for factoring are according to the interpolation $(64(\log_2(n) - 2) + 29.46)n^3$. See Thomas Haner, Martin Roetteler, and Krysta M. Svore, "Factoring using 2n + 2 qubits with Toffoli-based modular multiplication," arXiv preprint arXiv:1611.07995 (2016). Simulation time only refers to simulation of the elliptic curve group law.

| ECDLP in $E(\mathbb{F}_p)$ simulation results | | | | | Factoring of RSA modulus N interpolation from HRS16 | | |
|---|---|---|---|---|---|---|---|
| ⌈$\log_2(p)$⌉ bits | #Qubits | #Toffoli gates | Toffoli depth | Sim time sec | ⌈$\log_2(N)$⌉ bits | #Qubits | #Toffoli gates |
| 110 | 1014 | $9.44 \cdot 10^9$ | $8.66 \cdot 10^9$ | 273 | 512 | 1026 | $6.41 \cdot 10^{10}$ |
| 160 | 1466 | $2.97 \cdot 10^{10}$ | $2.73 \cdot 10^9$ | 711 | 1024 | 2050 | $5.81 \cdot 10^{11}$ |
| 192 | 1754 | $5.30 \cdot 10^{10}$ | $4.86 \cdot 10^{10}$ | 1,149 | — | — | — |
| 224 | 2042 | $8.43 \cdot 10^{10}$ | $7.73 \cdot 10^{10}$ | 1 881 | 2048 | 4098 | $5.20 \cdot 10^{12}$ |
| 256 | 2330 | $1.26 \cdot 10^{11}$ | $1.16 \cdot 10^{11}$ | 3 848 | 3072 | 6146 | $1.86 \cdot 10^{13}$ |
| 384 | 3484 | $4.52 \cdot 10^{11}$ | $4.15 \cdot 10^{11}$ | 17 003 | 7680 | 15362 | $3.30 \cdot 10^{14}$ |
| 521 | 4719 | $1.14 \cdot 10^{12}$ | $1.05 \cdot 10^{12}$ | 42 888 | 15360 | 30722 | $2.87 \cdot 10^{15}$ |

The reasons for the larger number of qubits lie in the implementation of the modular inversion algorithm. Proos and Zalka describe a version of the standard Euclidean algorithm which requires divisions with remainder. Example embodiments as disclosed herein implement the binary GCD algorithm, which only requires additions, subtractions and binary bit shifts. Section One optimization that applies to both algorithms is register sharing as proposed in Section 5.3.5 of Proos and Zalka. The standard Euclidean algorithm as well as the binary GCD work on four intermediate variables, requiring 4n bits in total. In the description in Section 4.4, these are the variables u,v,r,s. However, Proos and Zalka use a heuristic argument to show that they actually only need about $2n+8\sqrt{n}$ bits at any time during the algorithm. A major complication for implementing this optimization is that the boundaries between variables change during the course of the algorithm.

Since the basis for register sharing in Proos and Zalka is an experimental analysis, Proos and Zalka provide a space analysis that does not take into account the register sharing optimization. With this space analysis, one still needs about 2n qubits more than their Euclidean algorithm. These qubits come from the fact that example embodiments of the extended binary GCD algorithm disclsoed herein generate one bit of garbage in each of the 2n rounds. In contrast, Proos and Zalka only needs n carry qubits. Furthermore, an additional n-qubit register is used to copy out the result and the algorithm is run in reverse to clean-up all garbage and ancilla qubits.

7 Example Computing Environments

Figure 12:
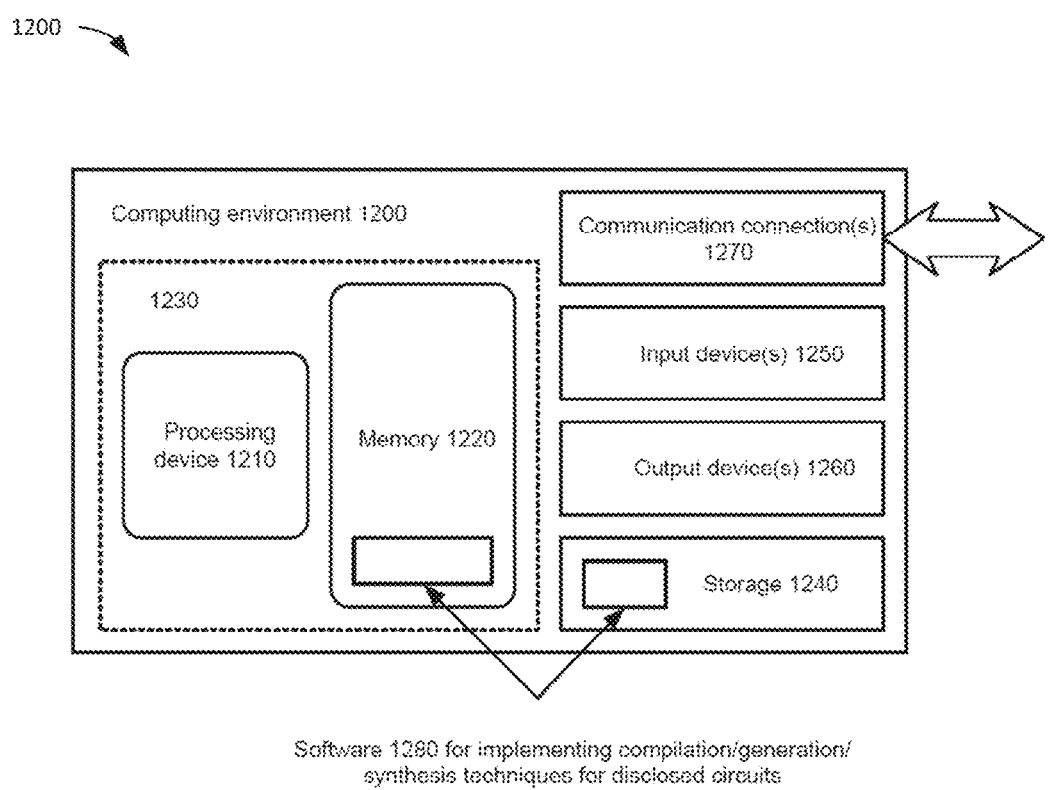
FIG. 12 illustrates a generalized example of a suitable computing environment in which several of the described embodiments can be implemented.

FIG. 12 illustrates a generalized example of a suitable computing environment 1200 in which several of the described embodiments can be implemented. The computing environment 1200 is not intended to suggest any limitation as to the scope of use or functionality of the disclosed technology, as the techniques and tools described herein can be implemented in diverse general-purpose or special-purpose environments that have computing hardware.

Figure 17:
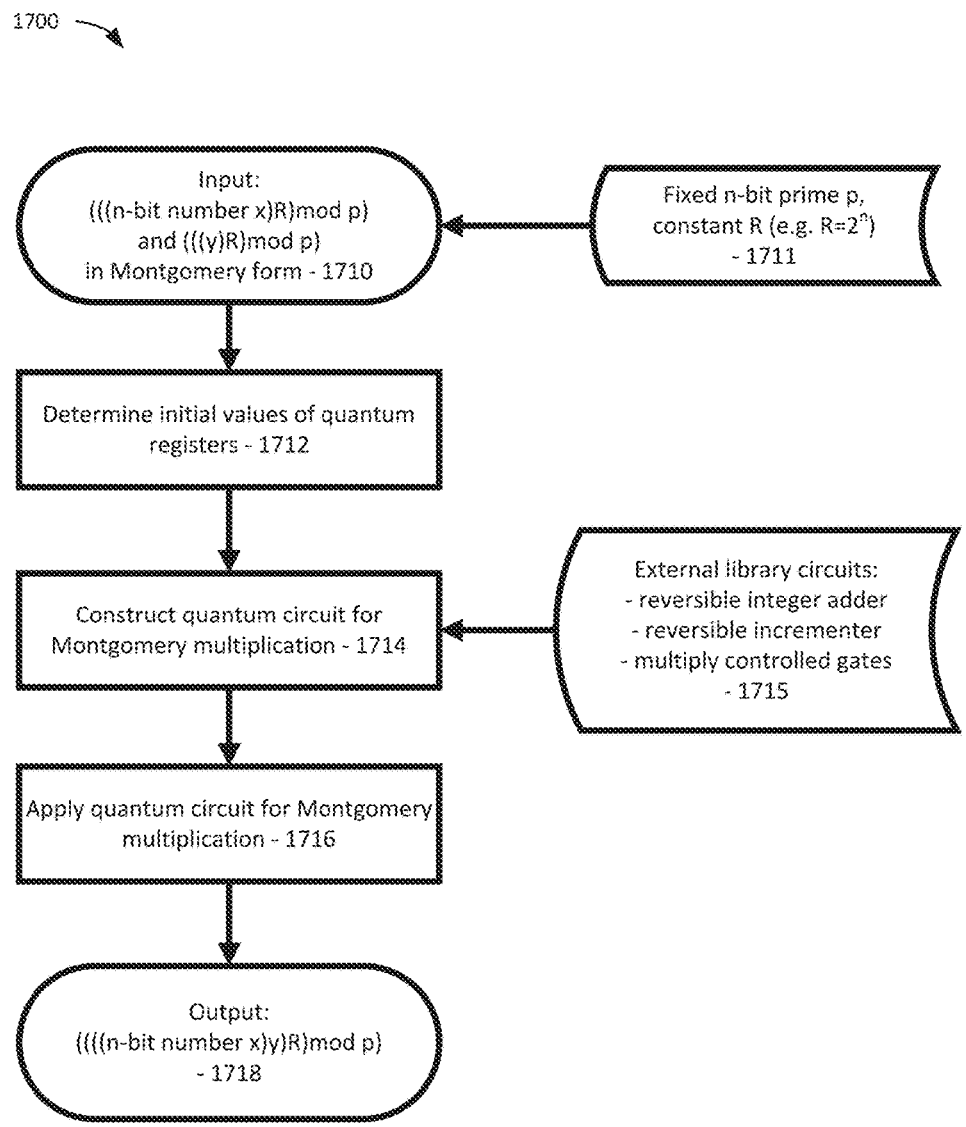
FIG. 17 is a flow chart showing an example method to compute product of two numbers mod p on a quantum computer.

With reference to FIG. 12, the computing environment 1700 includes at least one processing device 1210 and memory 1220. In FIG. 17, this most basic configuration 1230 is included within a dashed line. The processing device 1210 (e.g., a CPU or microprocessor) executes computer-executable instructions. In a multi-processing system, multiple processing devices execute computer-executable instructions to increase processing power. The memory 1220 may be volatile memory (e.g., registers, cache, RAM, DRAM, SRAM), non-volatile memory (e.g., ROM, EEPROM, flash memory), or some combination of the two. The memory 1220 stores software 1280 implementing tools for synthesizing, generating, or compiling one or more of the circuits as described herein.

The computing environment can have additional features. For example, the computing environment 1200 includes storage 1240, one or more input devices 1250, one or more output devices 1260, and one or more communication connections 1270. An interconnection mechanism (not shown), such as a bus, controller, or network, interconnects the components of the computing environment 1200. Typically, operating system software (not shown) provides an operating environment for other software executing in the computing environment 1200, and coordinates activities of the components of the computing environment 1200.

The storage 1240 can be removable or non-removable, and includes one or more magnetic disks (e.g., hard drives), solid state drives (e.g., flash drives), magnetic tapes or cassettes, CD-ROMs, DVDs, or any other tangible non-volatile storage medium which can be used to store information and which can be accessed within the computing environment 1200. The storage 1240 can also store instructions for the software 1280 implementing, generating, or synthesizing any of the described techniques, systems, or reversible circuits.

The input device(s) 1250 can be a touch input device such as a keyboard, touchscreen, mouse, pen, trackball, a voice input device, a scanning device, or another device that provides input to the computing environment 1200. The output device(s) 1260 can be a display device (e.g., a computer monitor, laptop display, smartphone display, tablet display, netbook display, or touchscreen), printer, speaker, or another device that provides output from the computing environment 1200.

The communication connection(s) 1270 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods, circuit design, or compilation/synthesis techniques for generating the disclosed circuits can be described in the general context of computer-readable instructions stored on one or more computer-readable media. Computer-readable media are any available media (e.g., memory or storage device) that can be accessed within or by a computing environment. Computer-readable media include tangible computer-readable memory or storage devices, such as memory 1220 and/or storage 1240, and do not include propagating carrier waves or signals per se (tangible computer-readable memory or storage devices do not include propagating carrier waves or signals per se).

Various embodiments of the methods disclosed herein can also be described in the general context of computer-executable instructions (such as those included in program modules) being executed in a computing environment by a processor. Generally, program modules include routines, programs, libraries, objects, classes, components, data structures, and so on, that perform particular tasks or implement particular abstract data types. The functionality of the program modules may be combined or split between program modules as desired in various embodiments. Computer-executable instructions for program modules may be executed within a local or distributed computing environment.

Figure 13:
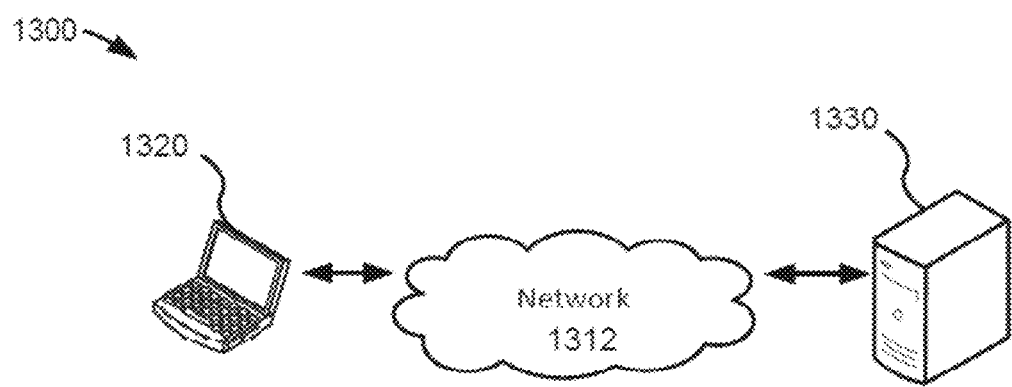
FIG. 13 illustrates an example of a possible network topology (e.g., a client-server network) for implementing a system according to the disclosed technology.

An example of a possible network topology 1300 (e.g., a client-server network) for implementing a system according to the disclosed technology is depicted in FIG. 13. Networked computing device 1320 can be, for example, a computer running a browser or other software connected to a network 1312. The computing device 1320 can have a computer architecture as shown in FIG. 13 and discussed above. The computing device 1320 is not limited to a traditional personal computer but can comprise other computing hardware configured to connect to and communicate with a network 1312 (e.g., smart phones, laptop computers, tablet computers, or other mobile computing devices, servers, network devices, dedicated devices, and the like). In the illustrated embodiment, the computing device 1320 is configured to communicate with a computing device 1330 (e.g., a remote server, such as a server in a cloud computing environment) via a network 1312. In the illustrated embodiment, the computing device 1320 is configured to transmit input data to the computing device 1330, and the computing device 1330 is configured to implement circuit generation or compilation/synthesis methods for generating any of the disclosed circuits and outputting results to the computing device 1320. Any of the data received from the computing device 1330 can be stored or displayed on the computing device 1320 (e.g., displayed as data on a graphical user interface or web page at the computing devices 1320). In the illustrated embodiment, the illustrated network 1312 can be implemented as a Local Area Network ("LAN") using wired networking (e.g., the Ethernet IEEE standard 802.3 or other appropriate standard) or wireless networking (e.g. one of the IEEE standards 802.11a, 802.11b, 802.11g, or 802.11n or other appropriate standard). Alternatively, at least part of the network 1312 can be the Internet or a similar public network and operate using an appropriate protocol (e.g., the HTTP protocol).

Figure 14:
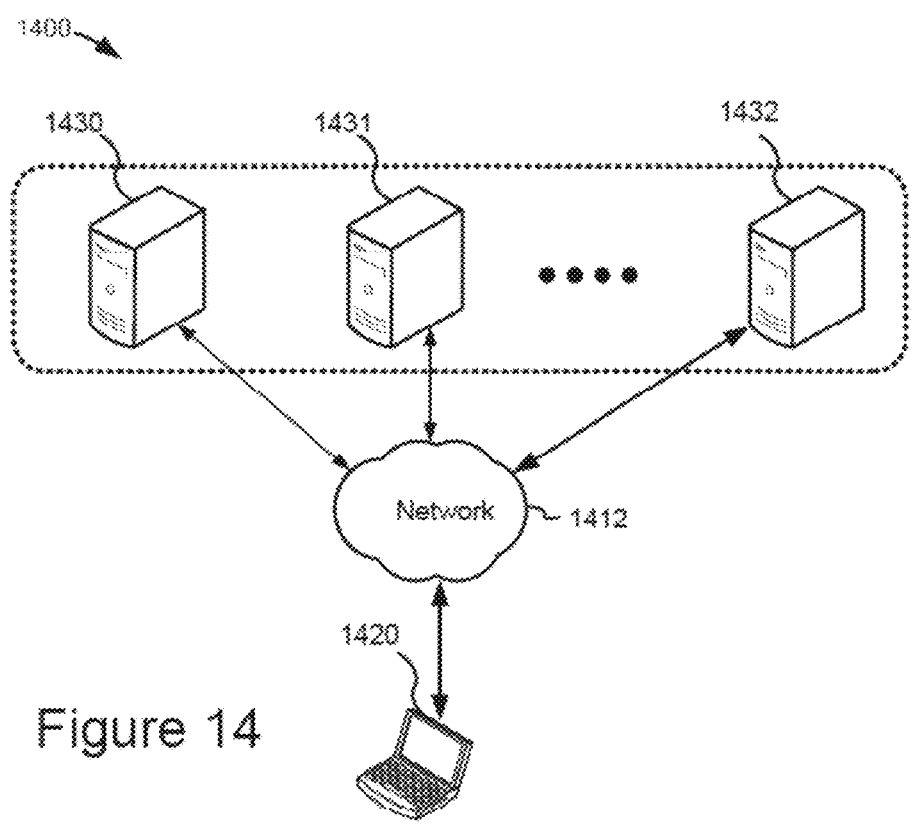
FIG. 14 illustrates another example of a possible network topology (e.g., a distributed computing environment) for implementing a system according to the disclosed technology.

Another example of a possible network topology 1400 (e.g., a distributed computing environment) for implementing a system according to the disclosed technology is depicted in FIG. 14. Networked computing device 1420 can be, for example, a computer running a browser or other software connected to a network 1412. The computing device 1420 can have a computer architecture as shown in FIG. 12 and discussed above. In the illustrated embodiment, the computing device 1420 is configured to communicate with multiple computing devices 1430, 1431, 1432 (e.g., remote servers or other distributed computing devices, such as one or more servers in a cloud computing environment) via the network 1412. In the illustrated embodiment, each of the computing devices 1430, 1431, 1432 in the computing environment 1400 is used to perform at least a portion of a circuit generation or synthesis/compilation process. In other words, the computing devices 1430, 1431, 1432 form a distributed computing environment in which the generation/compilation/synthesis processes are shared across multiple computing devices. The computing device 1420 is configured to transmit input data to the computing devices 1430, 1431, 1432, which are configured to distributively implement such as process, including performance of any of the disclosed methods or creation of any of the disclosed circuits, and to provide results to the computing device 1420. Any of the data received from the computing devices 1430, 1431, 1432 can be stored or displayed on the computing device 1420 (e.g., displayed as data on a graphical user interface or web page at the computing devices 1420). The illustrated network 1412 can be any of the networks discussed above with respect to FIG. 13.

Figure 15:
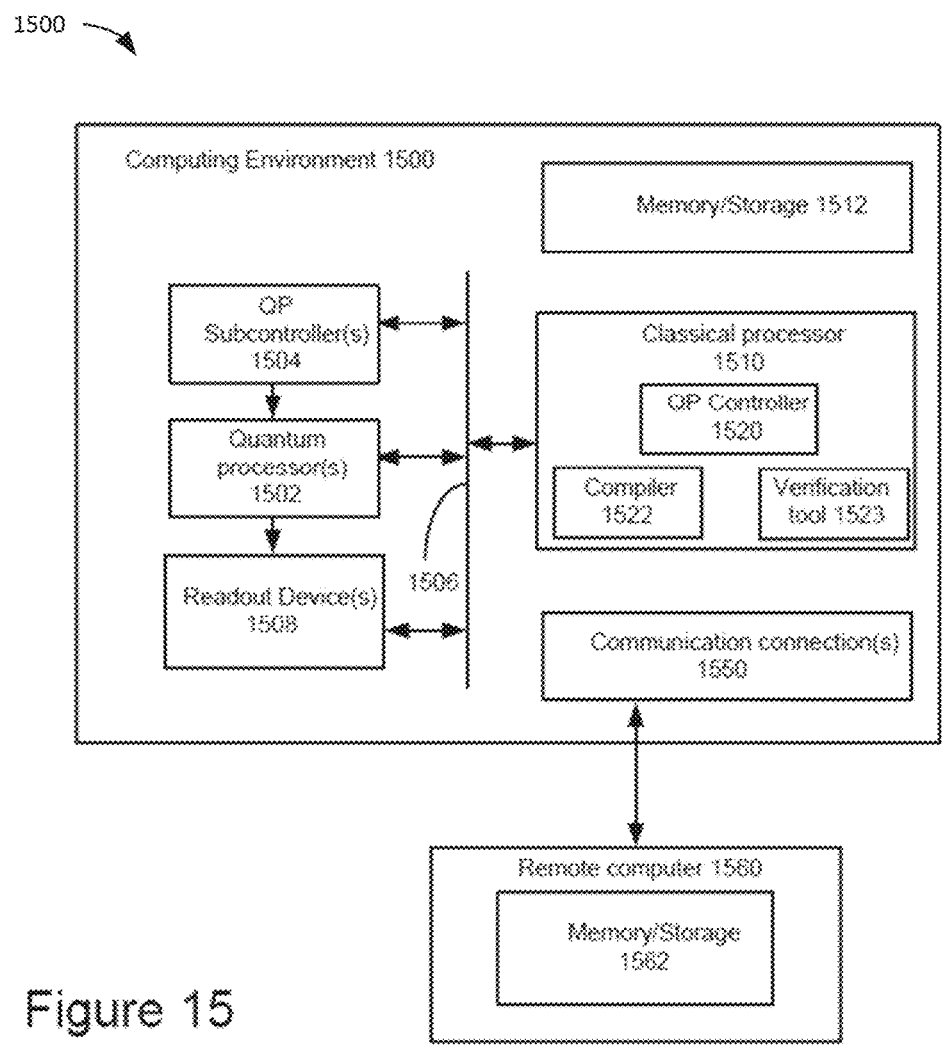
FIG. 15 illustrates an exemplary system for implementing the disclosed technology.

With reference to FIG. 15, an exemplary system for implementing the disclosed technology includes computing environment 1500. In computing environment 1500, a compiled quantum computer circuit description including any of the disclosed quantum circuits in accordance with any of the disclosed embodiments can be used to program (or configure) one or more quantum processing units such that the quantum processing unit(s) implement the circuit described by the quantum computer circuit description. The quantum computer circuit description can implement any of the disclosed circuits.

The environment 1500 includes one or more quantum processing units 1502 and one or more readout device(s) 1508. The quantum processing unit(s) execute quantum circuits that are precompiled and described by the quantum computer circuit description. The quantum processing unit(s) can be one or more of, but are not limited to: (a) a superconducting quantum computer; (b) an ion trap quantum computer; (c) a fault-tolerant architecture for quantum computing; and/or (d) a topological quantum architecture (e.g., a topological quantum computing device using Majorana zero modes). The precompiled quantum circuits, including any of the disclosed circuits, can be sent into (or otherwise applied to) the quantum processing unit(s) via control lines 1506 at the control of quantum processor controller 1520. The quantum processor controller (QP controller) 1520 can operate in conjunction with a classical processor 1510 (e.g., having an architecture as described above with respect to FIG. 12) to implement the desired quantum computing process. In the illustrated example, the QP controller 1520 further implements the desired quantum computing process via one or more QP subcontrollers 1504 that are specially adapted to control a corresponding one of the quantum processor(s) 1502. For instance, in one example, the quantum controller 1520 facilitates implementation of the compiled quantum circuit by sending instructions to one or more memories (e.g., lower-temperature memories), which then pass the instructions to low-temperature control unit(s) (e.g., QP subcontroller(s) 1504 that transmit, for instance, pulse sequences representing the gates to the quantum processing unit(s) 1502 for implementation. In other examples, the QP controller(s) 1520 and QP subcontroller(s) 1504 operate to provide appropriate magnetic fields, encoded operations, or other such control signals to the quantum processor(s) to implement the operations of the compiled quantum computer circuit description. The quantum controller(s) can further interact with readout devices 1508 to help control and implement the desired quantum computing process (e.g., by reading or measuring out data results from the quantum processing units once available, etc.)

With reference to FIG. 15, compilation is the process of translating a high-level description of a quantum algorithm into a quantum computer circuit description comprising a sequence of quantum operations or gates, which can include the circuits as disclosed herein. The compilation can be performed by a compiler 1522 using a classical processor 1510 (e.g., as shown in FIG. 12) of the environment 1500 which loads the high-level description from memory or storage devices 1512 and stores the resulting quantum computer circuit description in the memory or storage devices 1512.

In other embodiments, compilation and/or verification can be performed remotely by a remote computer 1500 (e.g., a computer having a computing environment as described above with respect to FIG. 12) which stores the resulting quantum computer circuit description in one or more memory or storage devices 1562 and transmits the quantum computer circuit description to the computing environment 1500 for implementation in the quantum processing unit(s) 1502. Still further, the remote computer 1500 can store the high-level description in the memory or storage devices 1562 and transmit the high-level description to the computing environment 1500 for compilation and use with the quantum processor(s). In any of these scenarios, results from the computation performed by the quantum processor(s) can be communicated to the remote computer after and/or during the computation process. Still further, the remote computer can communicate with the QP controller(s) 1520 such that the quantum computing process (including any compilation, verification, and QP control procedures) can be remotely controlled by the remote computer 1560. In general, the remote computer 1560 communicates with the QP controller(s) 1520, compiler/synthesizer 1522, and/or verification tool 1523 via communication connections 1550.

In particular embodiments, the environment 1500 can be a cloud computing environment, which provides the quantum processing resources of the environment 1500 to one or more remote computers (such as remote computer 1560) over a suitable network (which can include the internet).

8 Further Representative Embodiments

Among the embodiments disclosed herein are methods for performing Montgomery arithmetic in a quantum computer comprising any of the techniques disclosed herein. Further embodiments as disclosed herein include quantum circuits comprising any of the quantum devices for performing the Montgomery arithmetic operations.

Figure 16:
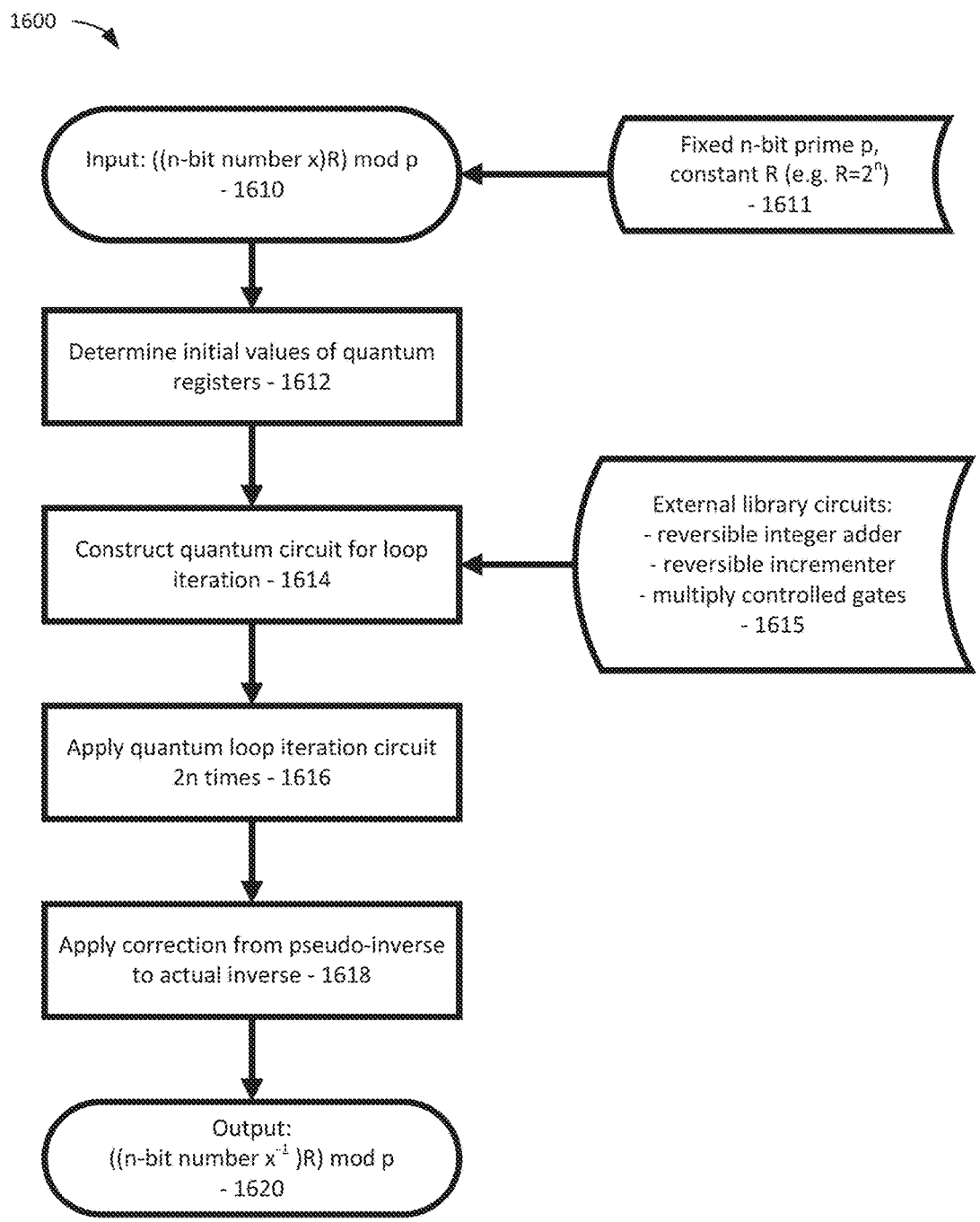
FIG. 16 is a flow chart showing an example method to compute modular inverse of a number mod p on a quantum computer.

FIG. 16 is a flowchart 1600 illustrating a technique for operating a quantum system in accordance with embodiments of the disclosed technology. In particular, the illustrated flowchart 1600 illustrates a method to compute the modular inverse of a number mod p on a quantum computer. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

At 1610, an n-bit input number x is input. x is an input, but it is a quantum input that can be in superposition of states. Additionally, a classical n-bit prime p and constant R are input. These values can be retrieved at 1611 (e.g., from a local memory, LUT, database, or other input mechanism).

At 1612, the initial values of quantum registers are determined as described herein.

At 1614, a quantum circuit for loop iteration is constructed in accordance with any of the disclosed techniques. In particular embodiments, this process is performed by a classical computer and can use constituent circuits from an external library 1615, including a reversible integer adder, a reversible incrementer, and/or a multiply controlled gate.

At 1616, the loop iteration circuit is applied 2n times. For instance, the quantum circuit generated at 1614, comprising a sequence of quantum circuits that perform the desired operation 2n times, can be loaded into a quantum computing device (e.g., using any of the quantum computing devices and/or quantum controllers discussed above with respect to FIG. 15), and the quantum computation performed for the relevant input values (e.g., resulting in application of the loop iteration circuit 2n times).

At 1618, a correction is applied to the result from the pseudo-inverse to the actual inverse. At 1620, the resultant inverse value is output (e.g., read out from the quantum computing device using an appropriate read-out device).

FIG. 17 is a flowchart 1700 illustrating a technique for operating a quantum system in accordance with embodiments of the disclosed technology. In particular, the illustrated flowchart 1700 illustrates a method to compute the product of two numbers (x and y) mod p on a quantum computer. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

At 1710, an n-bit input number x and an input number y are input. x and y are quantum inputs that can be in superposition of states. Additionally, a classical n-bit prime p and constant R are input. These values p and R can be retrieved at 1611 (e.g., from a local memory, LUT, database, or other input mechanism).

At 1712, the initial values of quantum registers are determined as described herein.

At 1714, a quantum circuit for Montgomery multiplication is constructed in accordance with any of the disclosed techniques. In particular embodiments, this process is performed by a classical computer and can use constituent circuits from an external library 1715, including a reversible integer adder, a reversible incrementer, and/or a multiply controlled gate.

At 1716, the Montgomery multiplication circuit is applied. For instance, the quantum circuit generated at 1714 can be loaded into a quantum computing device (e.g., using any of the quantum computing devices and/or quantum controllers discussed above with respect to FIG. 15), and the quantum computation performed for the relevant input values (e.g., resulting in application of the Montgomery multiplication circuit).

At 1718, the resultant multiplied value is output (e.g., read out from the quantum computing device using an appropriate read-out device).

Figure 18:
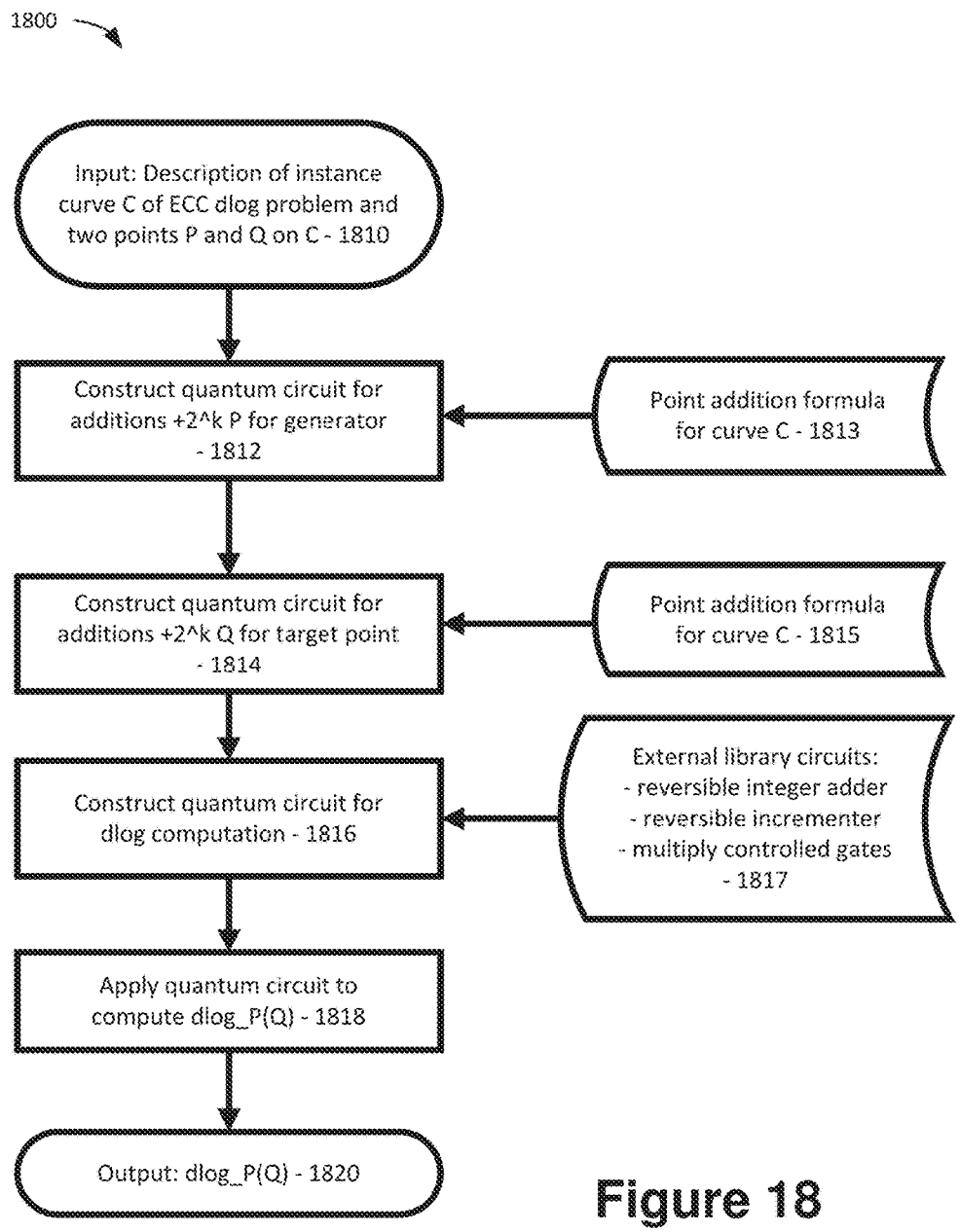
FIG. 18 is a flow chart showing an example method to compute the discrete logarithm over an elliptic curve on a quantum computer.

FIG. 18 is a flowchart 1800 illustrating a technique for operating a quantum system in accordance with embodiments of the disclosed technology. In particular, the illustrated flowchart 1800 illustrates a method to compute a discrete logarithm over an elliptic curve on a quantum computer. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

At 1810, a description of an instance elliptical curve C of an ECC discrete log (dlog) problem and two points P and Q on curve C are input.

At 1812, a quantum circuit is constructed for additions $+2^k$ P for a generator. The construction can use a point addition formula for curve C, which can be retrieved at 1813 (e.g., from a local memory, LUT, database, or other input mechanism).

At 1814, a quantum circuit is constructed for additions $+2^k$ Q for a target point. The construction can use a point addition formula for curve C, which can be retrieved at 1815 (e.g., from a local memory, LUT, database, or other input mechanism).

At 1816, a quantum circuit for the dlog computation is constructed in accordance with any of the disclosed techniques. In particular embodiments, this process is performed by a classical computer and can use constituent circuits from an external library 1817, including a reversible integer adder, a reversible incrementer, and/or a multiply controlled gate.

At 1818, the quantum circuit from 1816 circuit is applied. For instance, the quantum circuit generated at 1816 can be loaded into a quantum computing device (e.g., using any of the quantum computing devices and/or quantum controllers discussed above with respect to FIG. 15), and the quantum computation performed for the relevant input values (e.g., resulting in application of the dlog quantum circuit).

At 1820, the resultant value is output (e.g., read out from the quantum computing device using an appropriate read-out device).

Figure 19:
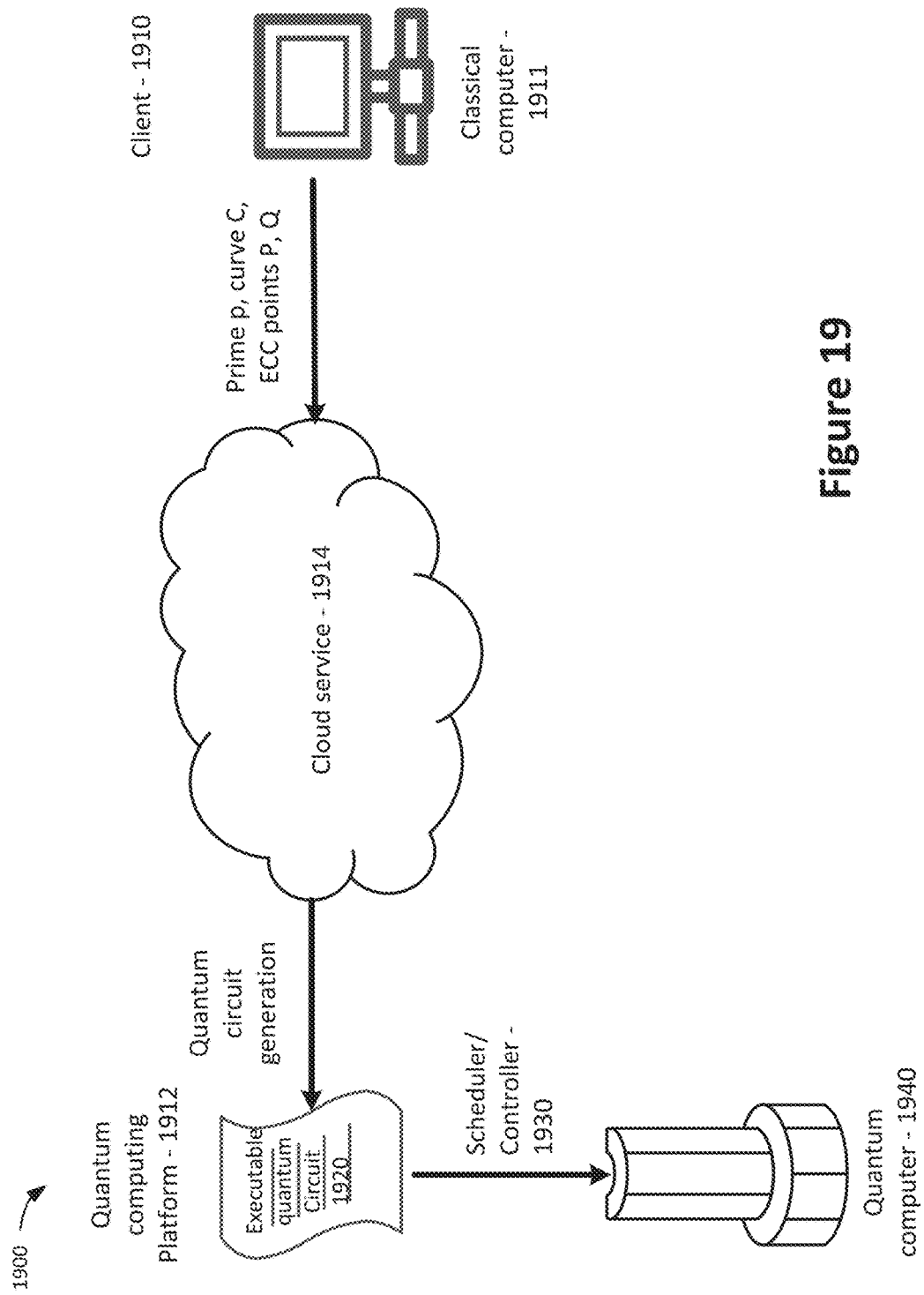
FIGS. 19 and 20 are schematic block diagrams for an example system connecting a client with a quantum computing platform through a cloud service.

FIG. 19 is a schematic block diagram 1900 for an example system connecting a client 1910 (implemented by a classical computer 1911) with a quantum computing platform 1912 through a cloud service 1914. In the example embodiment, client 1910 uses the system 1900 to solve an instance of an ECC discrete log problem using circuit(s) (shown as executable quantum circuit 1920) automatically generated using any one or more of the disclosed methods for Montgomery arithmetic. Said circuits are generated by the cloud service in executable form that can be scheduled by a scheduler/controller 1930 for the quantum computer 1940 backend. Any of the configurations illustrated in FIG. 15 can be used to perform the illustrated process.

Figure 20:
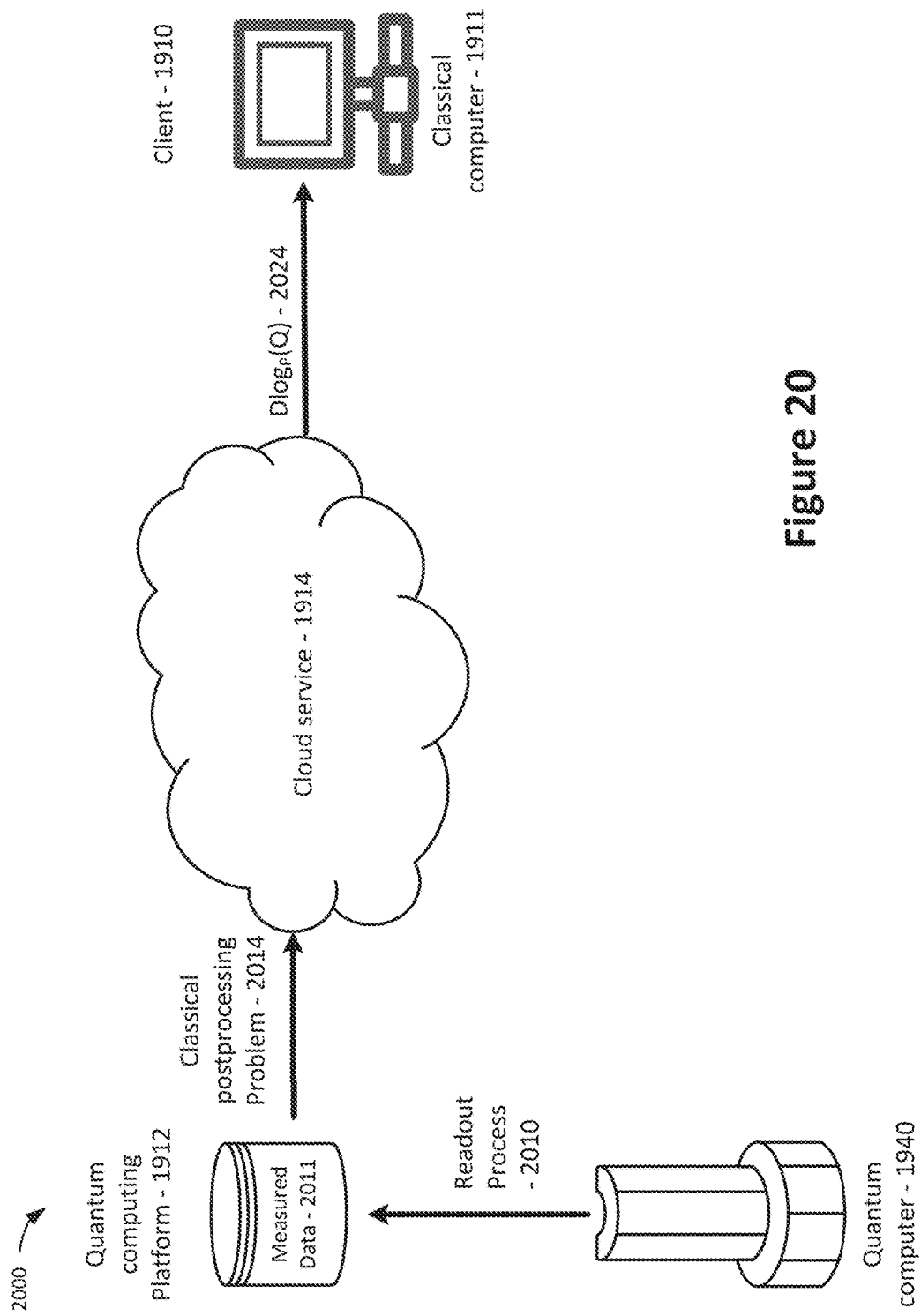

FIG. 20 is a schematic block diagram 2000 for an example system as in FIG. 19 after execution of the quantum circuit on the quantum computer backend 1940. In FIG. 20, a readout process 2010 gathers classical data in the form of measurement data 2011 from the quantum computer 1940. The classical data 2011 is then further post-processed (as a classical post-processing problem 2014) on classical machines that reside within the cloud service 1914 to produce the final result (shown at 2014). In the given embodiment, said final result 2024 is the discrete logarithm of Q with respect to P, e.g., the smallest integer k such that Q=kP and is transmitted to the client computer 1910.

As shown in FIGS. 19 and 20 and discussed above, embodiments of the disclosed technology can be a system comprising: a classical computer configured to automatically generate quantum arithmetic circuits for modular arithmetic; and a quantum computer configured to implement the quantum arithmetic circuits for modular arithmetic. In some implementations, the modular arithmetic is based on Montgomery encoding for a fixed prime number and fixed bit-size. In further implementations, the classical computer configured to automatically generate the quantum arithmetic circuits for modular arithmetic is implemented in a cloud service to which a client connects through a computer network. In certain implementations, the generated quantum circuit is executed by a controller on the quantum computer. In some implementations, the quantum computer is measured by a readout device configure to collect classical measured data, and the measured data is further post-processed by a cloud service, leading to a final classical result that is returned to the client. In further implementations, the modular arithmetic is used to compute discrete logarithms of points with respect to a generator point on a elliptic curve.

Figure 21:
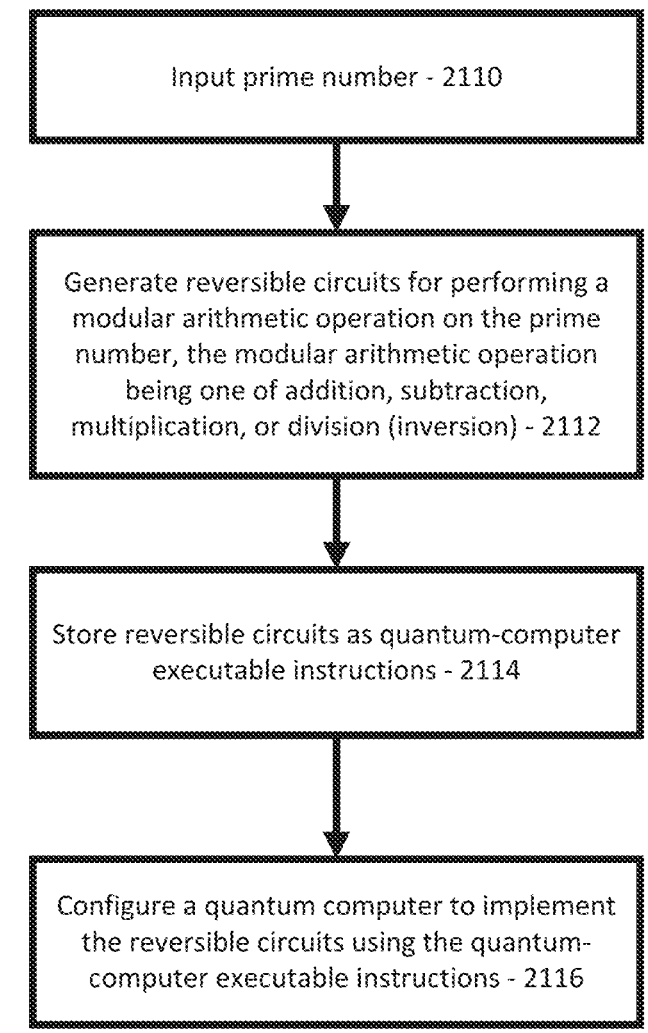
FIG. 21 is a flowchart illustrating another technique for operating a quantum system in accordance with embodiments of the disclosed technology.

FIG. 21 is a flowchart 2100 illustrating a technique for operating a quantum system in accordance with embodiments of the disclosed technology. In particular, the illustrated flowchart 2100 illustrates a method to generate reversible circuits for performing modular arithmetic operations on a quantum computer. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

At 2110, a prime number is input. For example, the prime number can be an n-bit prime number input from a client computer as part of a request to perform a modular arithmetic operation. In some implementations, the data on which the modular arithmetic operation acts is encoded using Montgomery encoding for at least the underlying prime number.

At 2112, reversible circuits are generated for performing a modular arithmetic operation on the prime number. In the illustrated embodiment, the modular arithmetic operation is one of addition, subtraction, multiplication, or division (inversion).

At 2114, the reversible circuits are stored as quantum-computer executable instructions.

At 2116, a quantum computer is configured to implement the reversible circuits using the quantum-computer executable instructions.

In some implementations, the data on which the modular arithmetic operation acts is encoded using Montgomery encoding for at least the underlying prime number. In further implementations, the modular arithmetic operation performed is addition, and the addition operation is implemented using a quantum circuit for integer addition, followed by a reversible circuit that tests for overflows and reduces an output modulo by the prime number (if necessary). In certain implementations, the modular arithmetic operation performed is subtraction, and the subtraction operation is implemented using a quantum circuit for integer addition, followed by a reversible circuit that tests for overflows and reduces an output modulo by the prime number if necessary. In some implementations, the modular arithmetic operation performed is multiplication, and the multiplication operation is implemented iteratively by conditionally updating an accumulator by a shifted version of the prime number and a prime modulus followed by a qubit permutation that realizes a division by 2. In further implementations, the modular arithmetic operation performed is division, and the division relies on a reversible computation of a Montgomery inverse by an iterative process that is executed by a specified number of steps and that involves a reduction sub-process and a counting sub-process. In some cases, the iterative progress comprises computation of a predicate that is checked in each round of the algorithm for termination of a reduction process and start of a counting process, the reduction process involves a case distinction of a current state of quantum registers, the outcomes of the case distinction are stored in no more than 4 separate qubits per round, and the reduction sub-process is conditional on the outcomes of the case distinction.

Also disclosed herein are embodiments of a quantum computing device for performing a modular arithmetic operations. For example, certain embodiments comprise a quantum computing device configured to implement a sequence of reversible circuits that, in combination, perform a modular arithmetic operation on a prime number (e.g., a Montgomery encoded prime number). In particular examples, the modular arithmetic operation is one of addition, subtraction, multiplication, or division. In some implementations, the modular arithmetic operation performed is addition, and the addition operation is implemented using a quantum circuit for integer addition, followed by a reversible circuit that tests for overflows and reduces an output modulo by the prime number if necessary. In other implementations, the modular arithmetic operation performed is subtraction, and the subtraction operation is implemented using a quantum circuit for integer addition, followed by a reversible circuit that tests for overflows and reduces an output modulo by the prime number if necessary. In further implementations, the modular arithmetic operation performed is multiplication, and the multiplication operation is implemented iteratively by conditionally updating an accumulator by a shifted version of the prime number and a prime modulus followed by a qubit permutation that realizes a division by 2. In some implementations, the modular arithmetic operation performed is division, and the division relies on a reversible computation of a Montgomery inverse by an iterative process that is executed by a specified number of steps and that involves a reduction sub-process and a counting sub-process. In some cases, for instances, the iterative progress comprises computation of a predicate that is checked in each round of the algorithm for termination of a reduction process and start of a counting process, the reduction process involves a case distinction of a current state of quantum registers, outcomes of the case distinction are stored in no more than 4 separate qubits per round, and the reduction sub-process is conditional on the outcomes of the case distinction.

9 Concluding Remarks

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

What is claimed is:

1. A computer-implemented method, comprising:
inputting a prime number;
generating reversible circuit designs for performing a modular arithmetic operation on the prime number, the modular arithmetic operation being one of addition, subtraction, multiplication, or division; and
storing the reversible circuit designs as quantum-computer executable instructions.

2. The method of claim 1, further comprising configuring a quantum computer to implement the reversible circuits described by the reversible circuit designs using the quantum-computer executable instructions.

3. The method of claim 1, wherein the data on which the modular arithmetic operation acts is encoded using Montgomery encoding for the underlying prime number.

4. The method of claim 1, wherein the modular arithmetic operation performed is addition, and wherein the addition operation is implemented using a quantum circuit design for integer addition, followed by a reversible circuit that tests for overflows and reduces an output modulo by the prime number if necessary.

5. The method of claim 1, wherein the modular arithmetic operation performed is subtraction, and wherein the subtraction operation is implemented using a quantum circuit design for integer addition, followed by a reversible circuit that tests for overflows and reduces an output modulo by the prime number if necessary.

6. The method of claim 1, wherein the modular arithmetic operation performed is multiplication, and wherein the multiplication operation is implemented iteratively by conditionally updating an accumulator by a shifted version of the prime number and a prime modulus followed by a qubit permutation that realizes a division by 2.

7. The method of claim 1, wherein the modular arithmetic operation performed is division, and wherein the division relies on a reversible computation of a Montgomery inverse by an iterative process that is executed by a specified number of steps and that involves a reduction sub-process and a counting sub-process.

8. The method of claim 7, wherein the iterative progress comprises computation of a predicate that is checked in each round of the algorithm for termination of a reduction process and start of a counting process, wherein the reduction process involves a case distinction of a current state of quantum registers, wherein outcomes of the case distinction are stored in no more than 4 separate qubits per round, and wherein the reduction sub-process is conditional on the outcomes of the case distinction.

9. A quantum computing device configured to implement a sequence of reversible circuits that in combination, perform a modular arithmetic operation on a prime number, the modular arithmetic operation being one of addition, subtraction, multiplication, or division.

10. The quantum computing device of claim 9, wherein the modular arithmetic operation performed is addition, and wherein the addition operation is implemented using a quantum circuit for integer addition, followed by a reversible circuit that tests for overflows and reduces an output modulo by the prime number if necessary.

11. The quantum computing device of claim 9, wherein the modular arithmetic operation performed is subtraction, and wherein the subtraction operation is implemented using a quantum circuit for integer addition, followed by a reversible circuit that tests for overflows and reduces an output modulo by the prime number if necessary.

12. The quantum computing device of claim 9, wherein the modular arithmetic operation performed is multiplication, and wherein the multiplication operation is implemented iteratively by conditionally updating an accumulator by a shifted version of the prime number and a prime modulus followed by a qubit permutation that realizes a division by 2.

13. The quantum computing device of claim 9, wherein the modular arithmetic operation performed is division, and wherein the division relies on a reversible computation of a Montgomery inverse by an iterative process that is executed by a specified number of steps and that involves a reduction sub-process and a counting sub-process.

14. The quantum computing device of claim 13, wherein the iterative progress comprises computation of a predicate that is checked in each round of the algorithm for termination of a reduction process and start of a counting process, wherein the reduction process involves a case distinction of a current state of quantum registers, wherein outcomes of the case distinction are stored in no more than 4 separate qubits per round, and wherein the reduction sub-process is conditional on the outcomes of the case distinction.

* * * * *